(12) United States Patent
Norimatsu et al.

(10) Patent No.: US 8,442,461 B2
(45) Date of Patent: May 14, 2013

(54) TRANSMITTER AND SEMICONDUCTOR INTEGRATED CIRCUIT AVAILABLE FOR IT

(75) Inventors: Takayasu Norimatsu, Tachikawa (JP); Taizo Yamawaki, Tokyo (JP); Yukinori Akamine, Kokubunji (JP); Koji Maeda, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 295 days.

(21) Appl. No.: 12/854,216

(22) Filed: Aug. 11, 2010

(65) Prior Publication Data

US 2011/0059704 A1 Mar. 10, 2011

(30) Foreign Application Priority Data

Sep. 10, 2009 (JP) ................................ 2009-209291

(51) Int. Cl.
*H03C 1/62* (2006.01)
*H04B 17/00* (2006.01)

(52) U.S. Cl.
USPC .................... 455/115.2; 455/67.11; 455/110; 375/302

(58) Field of Classification Search ............... 455/67.11, 455/67.14, 67.16, 108, 110, 115.1, 115.2; 375/300, 302
See application file for complete search history.

(56) References Cited

U.S. PATENT DOCUMENTS

| | | | |
|---|---|---|---|
| 6,937,668 B2 * | 8/2005 | Sridharan et al. | 375/296 |
| 7,072,626 B2 * | 7/2006 | Hadjichristos | 455/126 |
| 7,359,680 B2 | 4/2008 | Klemmer | |
| 7,953,379 B2 * | 5/2011 | Poloni | 455/115.1 |
| 7,983,359 B2 * | 7/2011 | Reddy et al. | 375/298 |
| 8,064,848 B2 * | 11/2011 | Chen et al. | 455/102 |

FOREIGN PATENT DOCUMENTS

| | | |
|---|---|---|
| JP | 2005-287011 A | 10/2005 |
| JP | 2006-311489 A | 11/2006 |
| JP | 2008-514044 A | 5/2008 |

OTHER PUBLICATIONS

A. Hietala, A Quad-Band 8PSK/GMSK Polar Transceiver, IEEE Journal of Solid-State Circuits, vol. 41, No. 5, May 2006, pp. 1133-1141.
T. Sowlati et al., Quad-Band GSM/GPRS/EDGE Polar Loop Transmitter, IEEE Journal of Solid-State Circuits, vol. 39, No. 12, Dec. 2004, pp. 2179-2189.

* cited by examiner

*Primary Examiner* — Quochien B Vuong
(74) *Attorney, Agent, or Firm* — Mattingly & Malur, PC

(57) ABSTRACT

The transmitter synthesizes amplitude and phase components and calibrates a delay mismatch between amplitude and phase components with high accuracy at high speed. The transmitter has: a digital-to-analog converter (DAC) and a low-pass filter (LPF) in its amplitude-signal path; and a phase modulator operable to convert up a phase component into an RF component in its phase-signal path. In an operation of delay calibration, a test input signal is supplied to a delay-calibrating unit in the amplitude-signal path, and the delay-calibrating unit provides a test input signal to DAC. Then, LPF generates a test output signal. The delay-calibrating unit detects a delay of the test output signal relative to the test input signal, calibrates an amplitude signal delay in a range from the input of the delay-calibrating unit to the output of LPF, reduces the difference between amplitude and phase signal delays of the phase modulator in the phase-signal path.

18 Claims, 12 Drawing Sheets

TRANSMITTER AND SEMICONDUCTOR INTEGRATED CIRCUIT AVAILABLE FOR IT

CLAIM OF PRIORITY

The Present application claims priority from Japanese application JP 2009-209291 filed on Sep. 10, 2009, the content of which is hereby incorporated by reference into this application.

FIELD OF THE INVENTION

The present invention relates to a transmitter and a semiconductor integrated circuit available for it. Particularly, it relates to a technique useful for high-speed and highly-precise calibration of a delay mismatch between an amplitude component and a phase component in a transmitter of Polar Modulation type (PM: Polar Modulation).

BACKGROUND OF THE INVENTION

In recent years, communication devices such as mobile-phone terminals have made progress in the integration scale of baseband processors, and there has been a trend for such communication devices to have no digital-to-analog converter (DAC) nor analog-to-digital converter (ADC) inside baseband processors for achievement of higher integration according to the scaling down and reduction in power consumption. With this being the case, an interface between a baseband processor and an RFIC (Radio Frequency Integrated Circuit) is arranged to be digital compliant, and a digital-to-analog converter (DAC) and an analog-to-digital converter (ADC) are included in an RFIC with a lower packing density rather than a baseband processor.

Further, as seen for communication devices compliant with LTE (Long Term Evolution), the data rate of transmit/receive baseband signals is being increased, and therefore digital interfaces are becoming faster. To cope with such faster digital interfaces, CMOS miniaturization is going on with RFICs. Such CMOS miniaturization leads to larger variations between devices, and the number of circuit blocks on which calibration of property variation inside an RFIC must be conducted is increasing. As a result, a calibration time which can be assigned to each circuit block inside an RFIC tends to be subject to a restriction.

Communication devices including mobile-phone terminals are relatively larger in transmit output power. Therefore, to keep communication devices from interfering with received signals of other users, communication devices are strictly restricted by the standards in spurious levels of receive bands and transmit bands used for other radio systems. For this purpose, with regard to an RFIC with a built-in transceiver, it is essential to lower the noise level in a receive band. In some cases, a filter including a SAW (Surface Acoustic Wave) device is placed between an RFIC and a high power amplifier (HPA) for transmission. However, such an arrangement increases the cost of a mobile-phone terminal. Therefore, there is a tendency to avoid the use of an expensive filter of this type whenever possible.

Polar Modulation systems have been known as an architecture for actualizing a transmitter with reduced noise. Particularly, in the case that a transmitter needs to cope with both GSM (Global System for Mobile Communications), and EDGE (Enhanced Data for GSM. Evolution) systems, a Polar Modulation system, which can materialize a low-noise phase-signal path, has an advantage over other systems including a direct conversion system because GSM is a frequency modulation system. Now, a Polar Modulation system is a system such that I and Q signals in an orthogonal coordinate system are converted into amplitude and phase components, and after up-conversion of the phase signal to a higher frequency, the amplitude and phase components are synthesized, which is as described in the non-patent document presented by Alex W. Hietala, "A Quad-Band 8PSK/GMSK Polar Transceiver", IEEE JOURNAL OF SOLID-STATE CIRCUITS, VOL. 41, No. 5, MAY 2006, PP. 1133-1141.

Five architectures for EDGE-compliant transmitters are shown in the non-patent document presented by Tirdad Sowlati et al., "Quad-Band GSM/GPRS/EDGE Polar Loop Transmitter", IEEE JOURNAL OF SOLID-STATE CIRCUITS, VOL. 39, No. 12, DECEMBER 2004, PP. 2179-2189. Of these architectures, the latter three are relevant to a Polar Modulation system. More specifically, two of the three architectures are based on polar modulation means, and the last one is based on polar loop means. These architectures will be described below.

The first architecture of a Polar Modulation system involves the steps of: performing up-conversion of a phase component by use of a PLL (Phase-Locked Loop); and synthesizing amplitude and phase components in a mixer (Mixer) located before a power amplifier, which is herein abbreviated as PA. This arrangement can offer an architecture versatile in use because a typical linear power amplifier can be used. However, since the non-patent document presented by Tirdad Sowlati et al. describes a case that full modulation is performed before the power amplifier, the first architecture is unreliable in terms of its efficiency and output power control.

The second architecture of a Polar Modulation system involves the steps of: performing up-conversion of a phase component by use of a phase-locked loop (PLL); directly modulating an output power of a power amplifier (PA) by an amplitude component; and synthesizing the amplitude and phase components. According to the second architecture, an output of an RFIC can be put in a saturated state. Therefore, the signal-to-noise ratio (S/N) can be improved. Further, the power efficiency of the power amplifier can be increased because the power amplifier can operate remaining saturated. However, in the case of the second architecture, it is necessary to control the power amplifier with large variations in gain, and linearity of output power of the power amplifier is required.

The third architecture of a Polar Modulation system is similar to the second architecture, and it involves the step of synthesizing amplitude and phase components by use of the power amplifier. However, a transmitter according to the third architecture has a feedback path. Like the second architecture, the third architecture can improve the signal-to-noise ratio of an output of an RFIC, and can increase the power efficiency of the power amplifier. In addition, the influence of the non-linearity of the power amplifier, which becomes a problem in the case of the second architecture, can be reduced because a feedback loop is formed.

On another note, International Patent Publication No. JP-T-2008-514044 describes that a delay tracking circuit and a delay circuit are used for compensating the delay mismatch between amplitude and phase components recombined in a power amplifier, which can worsen the adjacent channel leakage power ratio (ACPR) of a polar modulation transmitter. According to JP-T-2008-514044, the delay tracking circuit tracks a delay of the amplitude-signal path, and the delay circuit regulates the phase-signal delay according to the delay of the amplitude-signal path, whereby the delay mismatch is compensated.

Further, Japanese Unexamined Patent Publication No. JP-A-2005-287011 discloses that a polar modulation transmitter is used to conduct a synchronous adjustment for correcting the delay difference between amplitude and phase signals, which can worsen the adjacent channel leakage power ratio (ACPR) and the error vector magnitude (EVM). According to JP-A-2005-287011, amplitude and phase signals for synchronous adjustment are supplied to a delay-difference detector, and the synchronous-adjustment control circuit controls a delay produced by the synchronous adjustment circuit, according to an output of the delay-difference detector.

In addition, Japanese Unexamined Patent Publication No. JP-A-2006-311489 describes means for reducing the variation of the loop gain of a phase-locked loop (PLL) of a radio transmitter for mobile communication. Specifically, an output of the voltage-controlled oscillator (VCO) is supplied to the first input terminal of the phase comparator (PD) of the PLL through a down-conversion mixer (DCM), whereas the frequency of an input signal supplied to the second input terminal of the phase comparator is changed stair-step-wise, and the response to the change is detected by an output of the voltage-controlled oscillator (VCO). In other words, the output of the voltage-controlled oscillator (VCO) is connected with a counter, the output of the counter is connected with an integrator, and the output of the integrator is connected with a control unit. The control unit optimizes the charge-pump current of a charge pump (CP) connected between the phase comparator (PD) and voltage-controlled oscillator (VCO), whereby the loop gain of the PLL is optimized.

SUMMARY OF THE INVENTION

On another note, the inventors were involved, prior to the invention, in the research and development of a CMOS RFIC (Radio Frequency Integrated Circuit) supporting a function of a radio transmitter compliant with a Polar Modulation system.

In the course of the research and development, the inventors found out that the third architecture of a Polar Modulation system which involves a feedback path had a problem, which is amplitude and phase loops must be matched with each other in loop properties, which restricts a usable power amplifier (PA). In consideration of the fact that a general-purpose power amplifier (PA) can be used, the first and second architectures which involve the conduction of polar modulation using an open circuit are advantageous. However, after the consideration of the first and second architectures of a Polar Modulation system, the inventors found out that the first and second had the following problem: a delay mismatch between amplitude and phase components worsens the adjacent channel leakage power ratio (ACPR) and the error vector magnitude (EVM). This problem had been pointed out by JP-T-2008-514044 and JP-A-2005-287011.

In a radio transmitter of a Polar Modulation system, a mismatch of delay between amplitude and phase components causes the deterioration of the adjacent channel leakage power ratio (ACPR) and error vector magnitude (EVM).

FIG. 1 is a diagram showing the structure of a polar modulation transmitter which the inventors have examined prior to the invention.

The polar modulation transmitter shown in FIG. 1 includes: an I/Q signal modulator 105 operable to generate I and Q signals; a coordinate-rotation-digital-computer (CORDIC) system 106; a digital-to-analog converter (DAC) 107; a low-pass filter (LPF) 108; a phase modulator (PMMOD) 109; a mixer 110; a power amplifier (PA) 102; a switch (SW) 103; and an antenna 104.

The I/Q signal modulator 105 incorporated in a baseband processor 101 sends an RFIC 100 I signals (in-phase signals) and Q signals (quadrature signals) on an orthogonal coordinate system, through a digital interface. The coordinate-rotation-digital-computer (CORDIC) system 106 of RFIC 100 performs conversion of I and Q signals into amplitude components (p) and phase components (8). The resultant digital amplitude component (p) is supplied to an input terminal of the digital-to-analog converter (DAC) 107, and then an analog amplitude signal arises from an output terminal of the digital-to-analog converter (DAC) 107. The low-pass filter (LPF) 108 filters out an alias component contained in such analog amplitude signal. The digital phase component (8) is input to the phase modulator (PMMOD) 109, and then converted up into a radio frequency component by the phase modulator (PMMOD) 109. Typically, the phase modulator (PMMOD) 109 includes a phase-locked loop (PLL). An amplitude component subjected to the filtration and a phase component resulting from the up-conversion into an RF component are synthesized by the mixer 110 into an RF transmit signal, which is output to the outside of RFIC 100. The RF transmit signal which RFIC 100 has output is amplified by the power amplifier (PA) 102, selectively output by the switch (SW) 103, and then launched toward a base station through the antenna 104.

In regard to the polar modulation transmitter shown in FIG. 1, the amplitude-signal path goes through the digital-to-analog converter (DAC) 107 and low-pass filter (LPF) 108, whereas the phase-signal path runs through the phase modulator (PMMOD) 109. The amplitude-signal path and the phase-signal path are different in transmission properties. Therefore, the quantity of delay varies between the amplitude-signal path and the phase-signal path. The difference between the amplitude-signal path and phase-signal path in the quantity of delay leads to the deterioration of the adjacent channel leakage power ratio (ACPR) and the error vector magnitude (EVM) because the mixer 110 synthesizes amplitude and phase components. In regard to an EDGE-compliant polar modulation transmitter, the influences of delay mismatch between amplitude components (AM) and phase components (PM) on the adjacent channel leakage power ratio (ACPR) and on the error vector magnitude (EVM) are presented by FIGS. 2 and 3, respectively.

FIG. 2 is a diagram showing the influence of delay mismatch between amplitude and phase components on the adjacent channel leakage power ratio (ACPR) concerning an EDGE-compliant polar modulation transmitter. In the drawing, the horizontal axis shows the time difference between amplitude and phase components in delay mismatch, whereas the vertical axis shows the magnitude of the adjacent channel leakage power ratio (ACPR). It can be seen from FIG. 2 that the adjacent channel leakage power ratio (ACPR) rises with an increase of the time difference of delay mismatch. For example, the adjacent channel leakage power ratio (ACPR) with an offset of 400 kHz is worse by about 10 dB with the time difference of delay mismatch of 25 ns.

FIG. 3 is a diagram showing the influence of delay mismatch between amplitude and phase components on the error vector magnitude (EVM) concerning an EDGE-compliant polar modulation transmitter. In the drawing, the horizontal axis shows the time difference between amplitude and phase components in delay mismatch, whereas the vertical axis shows the magnitude of the error vector magnitude (EVM). It can be seen from FIG. 3 that the error vector magnitude (EVM) rises with an increase of the time difference of delay mismatch. For example, the error vector magnitude (EVM) is worse by about 0.2% with the time difference of delay mismatch of 25 ns.

As can be seen from FIGS. 2 and 3, the delay mismatch between amplitude and phase components worsens the adjacent channel leakage power ratio (ACPR) and the error vector magnitude (EVM), and therefore it deteriorates the transmit characteristics of a high-performance EDGE-compliant polar modulation transmitter which achieves a high bit rate. Such deterioration of the transmit characteristics makes a primary cause of deterioration of a transmitter of this type, even if taking into account the influence of the linearity of a transmit circuit included in the transmitter and the like. Also, to meet the EDGE standard, the delay mismatch between amplitude and phase components is a technical problem which needs to be solved.

Prior to the invention, the inventors further considered the techniques disclosed by the patent documents, JP-T-2008-514044 and JP-A-2005-287011, cited in the description concerning the background.

First, the delay tracking circuit of the polar modulation transmitter disclosed in JP-T-2008-514044 needs a long time for an operation on average because the comparator compares an instantaneous value of an amplitude delay signal with the average value thereof, and it takes a longtime for compensation of the delay mismatch.

Second, in the polar modulation transmitter disclosed in JP-A-2005-287011, an amplitude signal for synchronous adjustment is produced by a combination of the amplitude control circuit and low-pass filter (LPF) and supplied to the delay-difference detector, whereas a phase signal for synchronous adjustment is output from the low-pass filter (LPF) of the phase comparator for controlling the oscillation frequency of the voltage-controlled oscillator (VCO) in the phase-locked loop (PLL) used as a phase modulator for modulating in frequency a phase signal into a high-frequency phase modulation signal, and supplied to the delay-difference detector. In the polar modulation transmitter disclosed by JP-A-2005-287011, to correct the delay difference between amplitude and phase signals, it is necessary to wait until the locking operation by the phase-locked loop (PLL) is terminated in response to a phase signal. Therefore, it takes a longtime to compensate a delay mismatch.

In the study of an RFIC supporting, in function, a radio transmitter compliant with a Polar Modulation system prior to the invention, the inventors examined a method including the steps of reducing the variation in delay of phase components and then calibrating the variation in delay of phase components, in order to compensate a delay mismatch between amplitude and phase components.

The variation in delay of phase components of the polar modulation transmitter depends on the variation in delay of the phase-locked loop (PLL) serving as a phase modulator placed in the phase-signal path of the polar modulation transmitter.

Hence, in the course of the study prior to the invention, the inventors arrived at the idea of taking advantage of the PLL optimization method as disclosed in JP-A-2006-311489, for reducing the variation in delay of phase components of the polar modulation transmitter.

More specifically, under the method for PLL calibration (calibrating operation) as described in JP-A-2006-311489, a control unit optimizes the charge pump current of a charge pump (CP) connected between a phase comparator (PD) and a voltage-controlled oscillator (VCO) during a calibrating operation period, whereby the PLL loop gain is optimized. According to the optimization method as described in JP-A-2006-311489, the frequency of a reference signal supplied to one input terminal of the phase comparator (PD) is changed stair-step-wise, and the current value of charge pump current of the charge pump (CP) is optimized so that a change of the oscillation frequency of the voltage-controlled oscillator (VCO) in response to the frequency change of the reference signal is optimum, whereby the PLL loop gain is optimized. However, as a result of the examination made by the inventors, it is shown that by using the PLL optimization method as described in JP-A-2006-311489, the PLL loop gain can be optimized, and the quantity of delay of the phase-locked loop (PLL) can be controlled to be substantially fixed.

The variation in delay of amplitude components of a polar modulation transmitter depends on a combination of the variation in delay of the digital-to-analog converter (DAC) 107 and the variation in delay of the low-pass filter (LPF) 108 which are placed in the amplitude-signal path of the polar modulation transmitter.

Therefore, the compensation of a delay mismatch between amplitude and phase components can be speeded up by executing the calibration, i.e., calibrating operation, in connection with the amplitude-signal path of the polar modulation transmitter, thereby to control the variation in delay of amplitude components to be substantially equal to the substantially fixed delay quantity of the PLL which is controlled by the calibration (calibrating operation) of the PLL.

The invention was made as a result of the examinations performed by the inventors prior to the invention.

It is an object of the invention to provide a transmitter operable to synthesize amplitude and phase components, which can calibrate a delay mismatch between amplitude and phase components with high accuracy at high speed.

The above and other objects of the invention and a novel feature thereof will become apparent from the description hereof and the accompanying drawings.

Of the preferred embodiments of the invention herein disclosed, a representative one will be briefly described below.

The representative embodiment is related to a transmitter operable to synthesize an amplitude component ($\rho$) and a phase component ($\theta$). The transmitter is characterized as follows.

The transmitter has a digital-to-analog converter (107) operable to respond to the amplitude component and a low-pass filter (108) supplied with an output of the digital-to-analog converter, both located in an amplitude-signal path along which the amplitude component is conveyed.

The transmitter includes a phase-signal path along which the phase component is conveyed, and a phase modulator (109) operable to convert up the phase component into a radio frequency component in the phase-signal path.

The transmitter further includes a delay-calibrating unit (201) connected with an input of the digital-to-analog converter in the amplitude-signal path. In an operation of delay calibration, the delay-calibrating unit (201) supplies a test input signal (210, 213) to the input of the digital-to-analog converter on receipt of supply of the test input signal (210) to an input thereof (see FIGS. 4 and 5).

In the operation of delay calibration, the delay-calibrating unit (201) detects a delay of a test output signal (212) coming out of an output of the low-pass filter (108) with respect to the test input signal (210) on receipt of supply of the test output signal (212).

In the operation of delay calibration, the delay-calibrating unit (201) calibrates an amplitude signal delay from the input of the delay-calibrating unit (201) to the output of the low-pass filter (108) in response to the delay of the test output signal (212), whereby a difference between the amplitude signal delay and a phase signal delay of the phase modulator (109) in the phase-signal path is reduced (see FIG. 6).

The effect achieved by the embodiment is briefly as follows.

According to the invention, it becomes possible to provide a transmitter operable to synthesize amplitude and phase components which can calibrate a delay mismatch between amplitude and phase components with high accuracy at high speed.

DETAILED DESCRIPTION OF THE PREFERRED EMBODIMENTS

Figure 1:
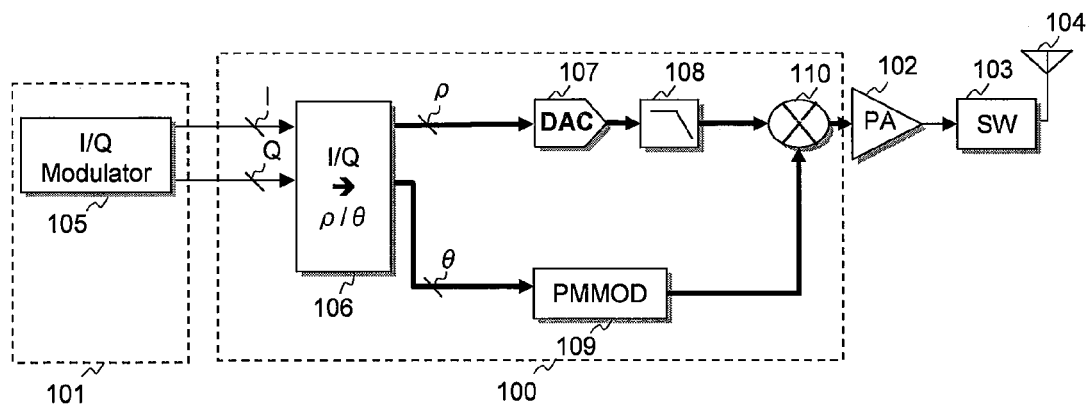
FIG. 1 is a diagram showing the structure of a polar modulation transmitter examined by the inventors prior to the invention.
Figure 2:
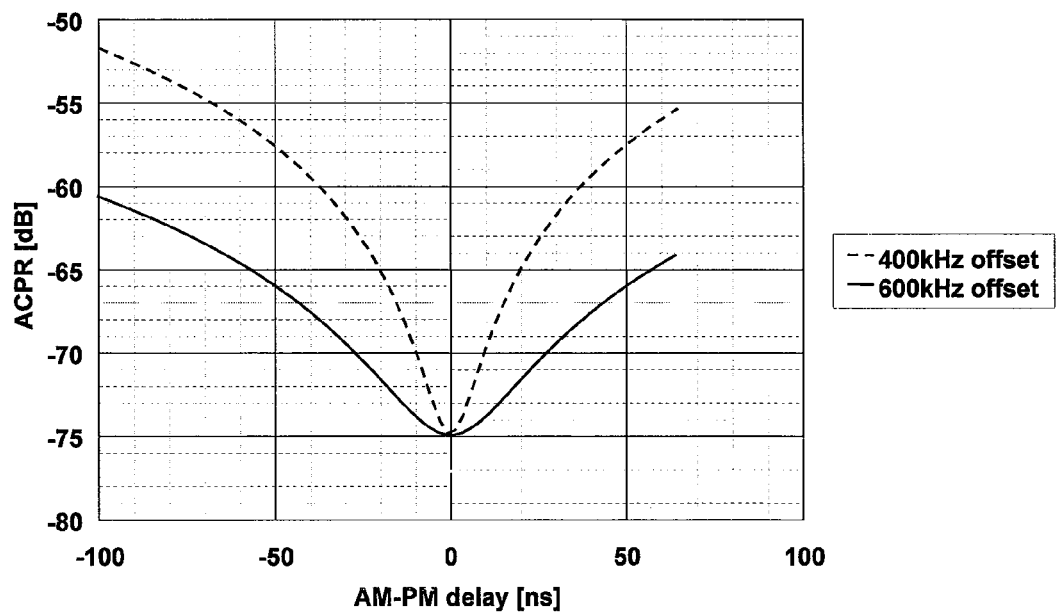
FIG. 2 is a diagram showing the influence of delay mismatch between amplitude and phase components on the adjacent channel leakage power ratio (ACPR) concerning an EDGE-compliant polar modulation transmitter.
Figure 3:
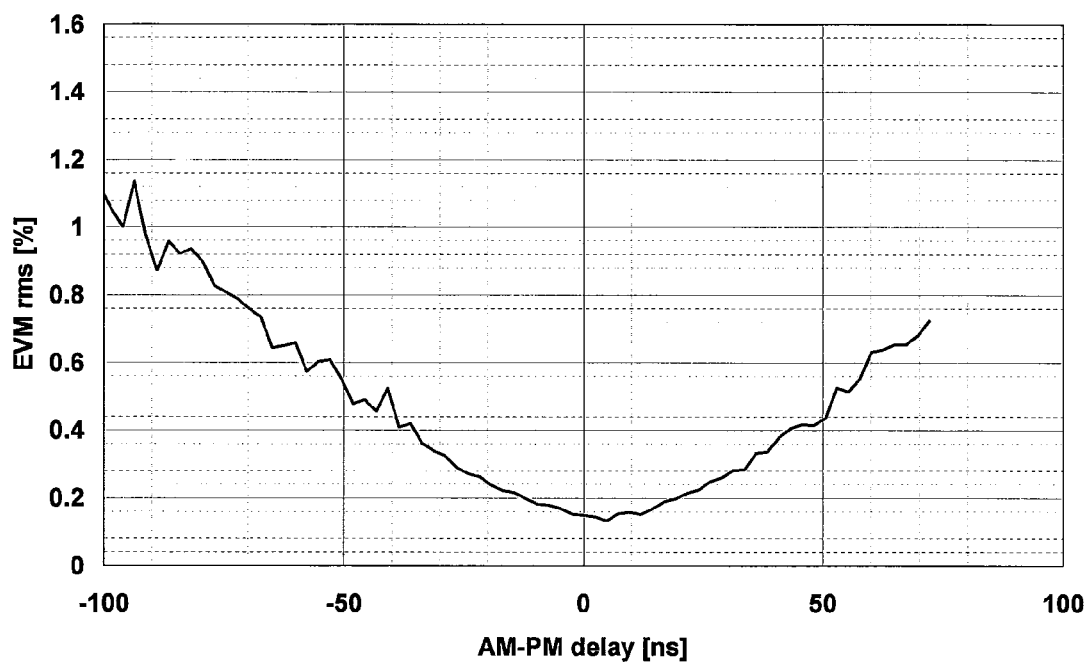
FIG. 3 is a diagram showing the influence of delay mismatch between amplitude and phase components on the error vector magnitude (EVM) concerning an EDGE-compliant polar modulation transmitter.

The preferred embodiments of the invention herein disclosed will be outlined first. Here, the reference numerals, characters and symbols for reference to the drawings, which are accompanied with paired round brackets, only exemplify what the concepts of parts, components or the like referred to by the numerals, characters and symbols contain.

[1] One of the preferred embodiments of the invention is related to a transmitter operable to synthesize an amplitude component ($\rho$) and a phase component ($\theta$). The transmitter is characterized as follows.

The transmitter has a digital-to-analog converter (107) operable to respond to the amplitude component, and a low-pass filter (108) supplied with an output of the digital-to-analog converter, both located in an amplitude-signal path along which the amplitude component is conveyed.

The transmitter further includes a phase modulator (109) operable to convert up the phase component into a radio frequency component, which is located in a phase-signal path along which the phase component is conveyed.

The transmitter further includes a delay-calibrating unit (201) in the amplitude-signal path, which is connected with an input of the digital-to-analog converter. In an operation of delay calibration, the delay-calibrating unit (201) provides a test input signal (210, 213) to the input of the digital-to-analog converter on receipt of supply of the test input signal (210) through its input (see FIGS. 4 and 5).

In the operation of delay calibration, the delay-calibrating unit (201) detects a delay of a test output signal (212) coming out of an output of the low-pass filter (108) with respect to the test input signal (210) on receipt of supply of the test output signal (212).

Figure 6:
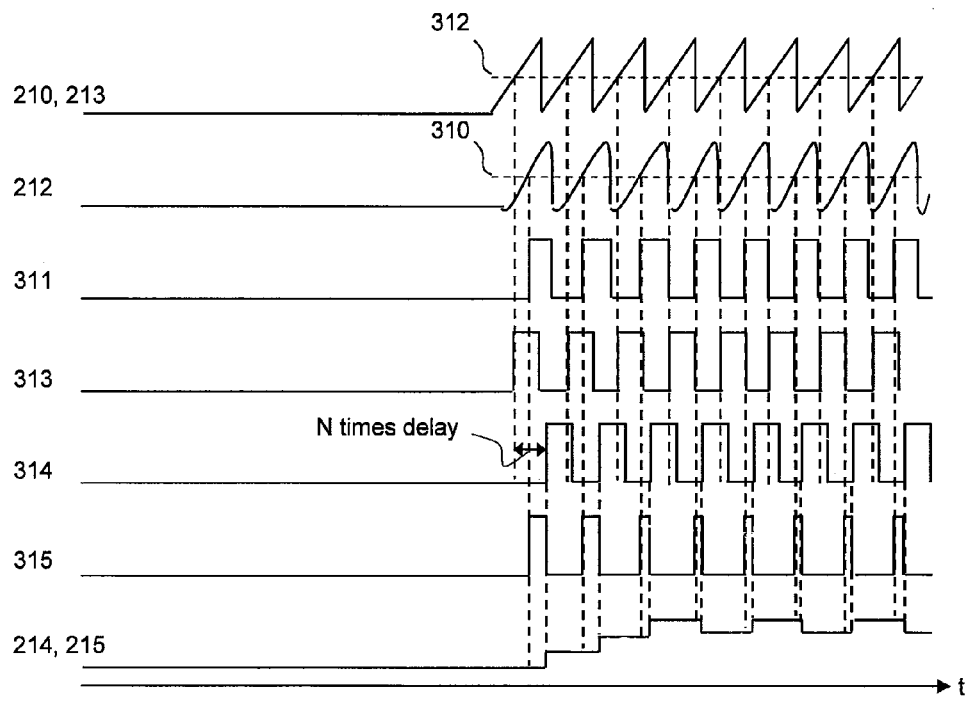
FIG. 6 is a diagram for explaining the operation of delay calibration by the polar modulation transmitter according to the first embodiment of the invention shown in FIGS. 4 and 5.

Further, in the operation of delay calibration, the delay-calibrating unit (201) calibrates an amplitude signal delay from the input of the delay-calibrating unit (201) to the output of the low-pass filter (108) in the amplitude-signal path in response to the delay of the test output signal (212), whereby a difference between the amplitude signal delay and a phase signal delay of the phase modulator (109) in the phase-signal path is reduced (see FIG. 6).

According to the embodiment, a transmitter operable to synthesize amplitude and phase components can calibrate a delay mismatch between amplitude and phase components with high accuracy at high speed.

Figure 14:
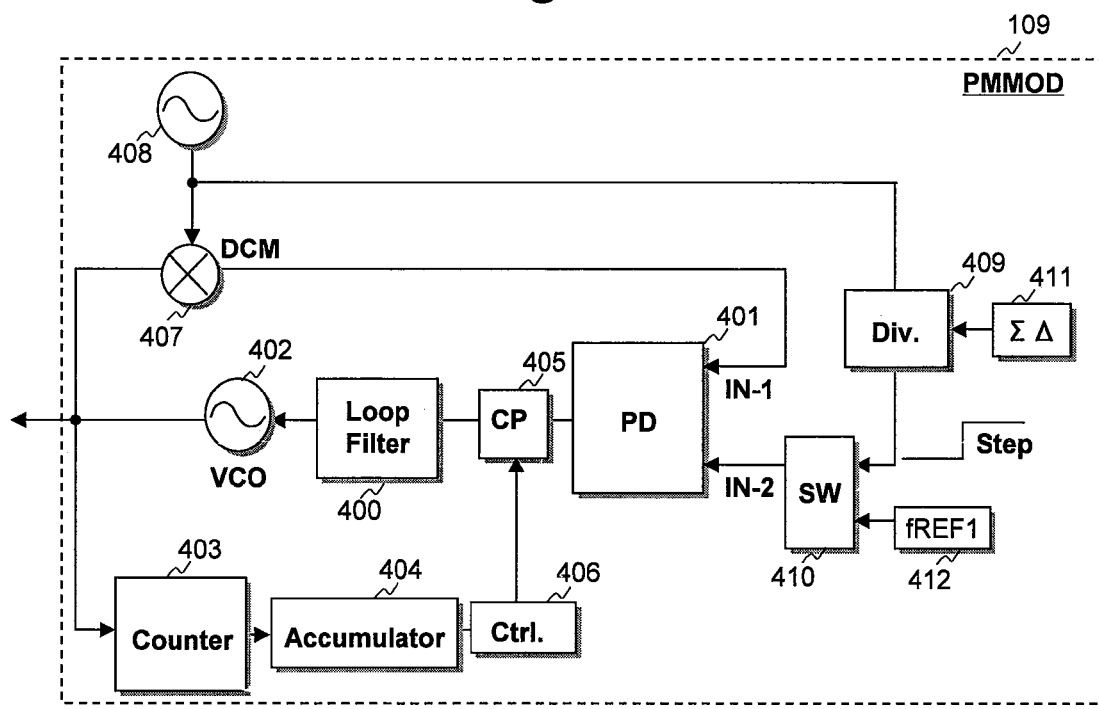
FIG. 14 is a diagram showing a structure of a phase-locked loop (PLL) serving as the phase modulator (PMMOD) 109 included in the polar modulation transmitter according to the first embodiment of the invention shown in FIG. 4.

According to another preferred embodiment, the phase modulator (109) has a phase-signal-delay-calibrating function for calibrating the phase signal delay into a predetermined value (see FIG. 14).

Figure 15:
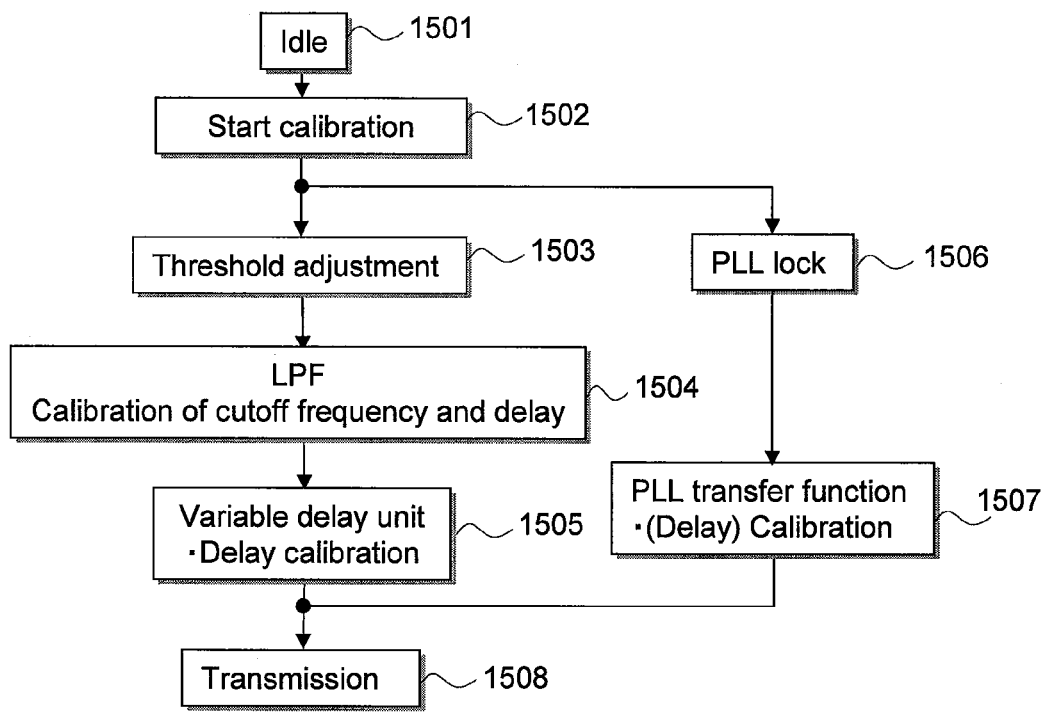
FIG. 15 is a diagram showing a sequence of steps of the operation of delay calibration executed in the polar modulation transmitter according to the first embodiment of the invention as described with reference to FIGS. 4, 5, 7, 12 and 14.

In the operation of delay calibration, the phase signal delay of the phase modulator (109) is calibrated into the predetermined value by the phase-signal-delay-calibrating function, and the delay-calibrating unit (201) calibrates the amplitude signal delay in response to the delay of the test output signal (212), thereby to reduce a difference between the amplitude signal delay and phase signal delay (see FIG. 15).

According to another preferred embodiment, the transmitter further includes a variable delay circuit (202) connected between an output of the delay-calibrating unit (201) in the amplitude-signal path and the input of the digital-to-analog converter (107).

Figure 4:
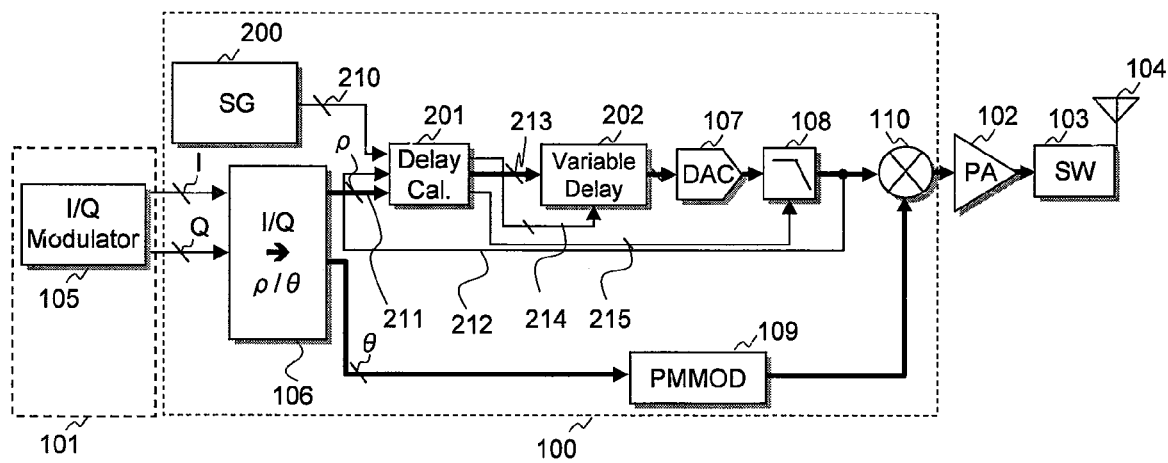
FIG. 4 is a diagram showing a structure of a polar modulation transmitter according to the first embodiment of the invention.
Figure 5:
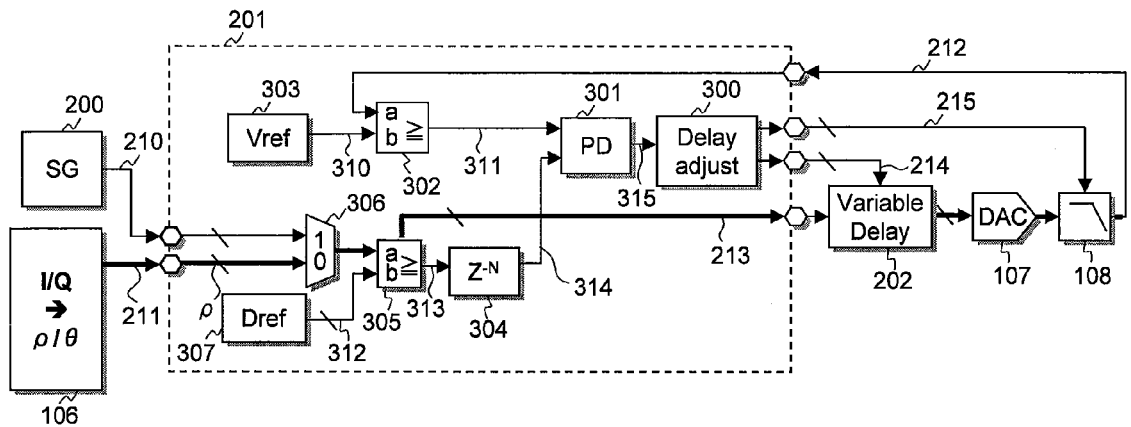
FIG. 5 is a diagram showing a structure of the delay-calibrating unit 201 included in the polar modulation transmitter according to the first embodiment of the invention shown in FIG. 4, and connections with other circuits.

In the operation of delay calibration, the delay-calibrating unit (201) controls, in quantity of delay, the variable delay circuit (202) and the low-pass filter (108) in response to the delay of the test output signal (212), thereby to calibrate the amplitude signal delay from the input of the delay-calibrating unit (201) to the output of the low-pass filter (108) (see FIGS. 4 and 5).

According to another preferred embodiment, the phase modulator (109) is composed of a phase-locked loop (PLL) including a phase comparator (401), a charge pump (405), a loop filter (400), and a control oscillator (402).

A charge/discharge current of the charge pump (405) operable to charge and discharge the loop filter (400) is adjusted by measuring an oscillation frequency of the control oscillator (402) during a transient response operation of the phase-locked loop (PLL) constituting the phase modulator (109), and the phase signal delay of the phase modulator (109) can be calibrated into the predetermined value (see FIG. 14).

According to another preferred embodiment, the delay-calibrating unit (201) includes a register (307), a digital comparator (305), a delay logic circuit (304), a phase comparator (301), an analog-voltage comparator (302), and a delay-adjust unit (300) (see FIG. 5).

The digital comparator (305) compares the test input signal (210) with a digital value with a reference code (312) set on the register (307).

The delay logic circuit (304) generates a reference delay output signal (314) in response to a compare-output signal (313) from the digital comparator (305).

The analog-voltage comparator (302) compares the test output signal (212) at the output of the low-pass filter (108) with a reference voltage (310), thereby to generate a voltage-compare-output signal (311).

The phase comparator (301) generates a phase-difference-detection signal (315) in response to the reference delay output signal (314) generated by the delay logic circuit (304), and the voltage-compare-output signal (311) generated by the analog-voltage comparator (302).

The delay-adjust unit (300) generates a first delay control signal (214) for controlling the quantity of delay of the variable delay circuit (202), and a second delay control signal (215) for controlling the quantity of delay of the low-pass filter (108) in response to the phase-difference-detection signal (315) generated by the phase comparator (301).

A voltage value of the reference voltage (310) can be set to be substantially equal to a voltage value of an analog voltage which the digital-to-analog converter (107) converts the reference code (312) set on the register (307) into (see FIGS. 5 and 6).

According to another preferred embodiment, the transmitter further includes a signal generator (200) operable to supply the test input signal (210) to the input of the delay-calibrating unit (201) in the operation of delay calibration (see FIGS. 4 and 5).

The signal generator (200) is activated to generate the test input signal (210) at time of power-on of an information-communication terminal equipped with the transmitter, and in the operation of delay calibration before a transmit operation by use of the information-communication terminal, which makes it possible to reduce a difference between the amplitude signal delay and phase signal delay.

According to another preferred embodiment, the transmitter further includes a digital calculation system (106) operable to convert an in-phase signal (I) and a quadrature signal (Q) of an orthogonal coordinate system which can be supplied through a digital interface, thereby to generate the amplitude component (ρ) and the phase component (θ).

During the transmit operation, the amplitude component (ρ) and phase component (θ) generated by the digital calculation system (106) can be respectively conveyed through the amplitude-signal path and phase-signal path respectively, and then synthesized.

In the operation of delay calibration before the transmit operation, the phase signal delay of the phase modulator (109) is calibrated into the predetermined value by the phase-signal-delay-calibrating function, and in parallel with this, the signal generator (200) is activated to generate the test input signal (210), whereby the reduction of the difference between the amplitude signal delay and phase signal delay is enabled (see FIG. 15).

According to another preferred embodiment, the operation of calibrating the delay of the amplitude-signal path, and the operation of calibrating the delay of the phase-signal path are executed in parallel. Therefore, the processing time for the operation of delay calibration can be shortened.

Figure 16:
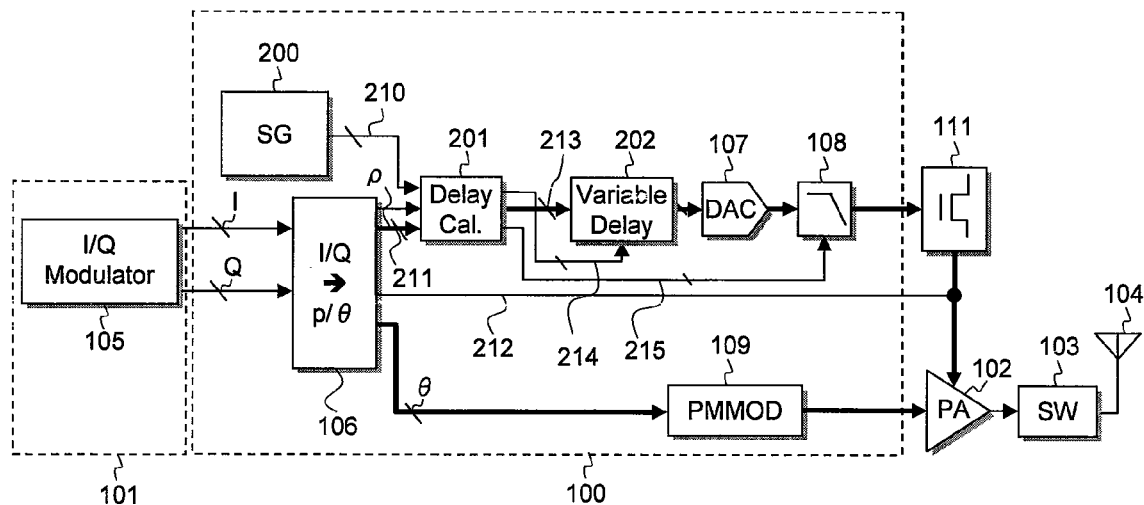
FIG. 16 is a diagram showing a structure of a polar modulation transmitter according to the second embodiment of the invention.

According to a specific embodiment, the transmitter further includes at least one of a mixer (110) and a regulator (111) for synthesizing the amplitude component (ρ) and phase component (θ) (see FIGS. 4 and 16).

Figure 18:
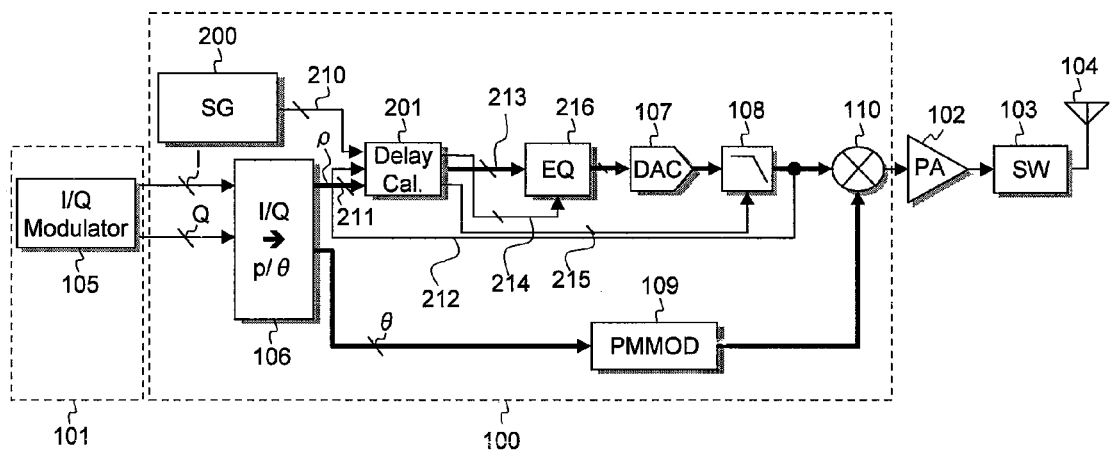
FIG. 18 is a diagram showing a structure of a polar modulation transmitter according to the fourth embodiment of the invention.

According to another specific embodiment, the variable delay unit (202) is composed of an equalizer (216) having a waveform-equalizing function (see FIG. 18).

According to the most specific embodiment, the transmitter is a transmitter based on a Polar Modulation system arranged to be capable of coping with both cases where the in-phase signal (I) and quadrature signal (Q) of the orthogonal coordinate system, which can be supplied to the digital calculation system (106), are in conformity with GSM, and where the signals are in conformity with EDGE.

[2] From another aspect, a representative of forms which embody the invention is a semiconductor integrated circuit (100) available for a transmitter which synthesizes an amplitude component ($\rho$) and a phase component ($\theta$).

The semiconductor integrated circuit includes a digital-to-analog converter (107) capable of response to the amplitude component, and a low-pass filter (108) supplied with an output of the digital-to-analog converter, both placed in an amplitude-signal path along which the amplitude component is conveyed.

The semiconductor integrated circuit further includes a phase modulator (109) operable to convert up the phase component into a radio frequency component and placed in a phase-signal path along which the phase component is conveyed.

The semiconductor integrated circuit further includes a delay-calibrating unit (201) connected with an input of the digital-to-analog converter, and placed in the amplitude-signal path. In an operation of delay calibration, the delay-calibrating unit (201) provides a test input signal (210, 213) to the input of the digital-to-analog converter on receipt of supply of the test input signal (210) to an input thereof (see FIGS. 4 and 5).

In the operation of delay calibration, the delay-calibrating unit (201) detects a delay of a test output signal (212) coming out of an output of the low-pass filter (108) with respect to the test input signal (210) on receipt of supply of the test output signal (212).

In the operation of delay calibration, the delay-calibrating unit (201) calibrates an amplitude signal delay from the input of the delay-calibrating unit (201) to the output of the low-pass filter (108) in the amplitude-signal path in response to the delay of the test output signal (212), whereby a difference between the amplitude signal delay and a phase signal delay of the phase modulator (109) in the phase-signal path is reduced (see FIG. 6).

According to the embodiment, as to a semiconductor integrated circuit available for a transmitter operable to synthesize amplitude and phase components, a delay mismatch between amplitude and phase components can be calibrated with high accuracy at high speed.

Further Detailed Description of the Preferred Embodiments

Subsequently, the embodiments will be described further in detail. Here, as to all the drawings to which reference is made in describing the preferred forms embodying the invention, the parts having identical functions are identified by the same reference numeral or character to avoid a repeat of description thereof.

First Embodiment

<<Structure of Polar Modulation Transmitter>>
FIG. 4 is a diagram showing a structure of a polar modulation transmitter according to the first embodiment of the invention.

The polar modulation transmitter according to the first embodiment of the invention shown in FIG. 4 is equivalent to the polar modulation transmitter shown in FIG. 1 additionally provided with a signal generator 200, a delay-calibrating unit 201 and a variable delay unit 202; the polar modulation transmitter of FIG. 1 is the one which the inventors have examined prior to the invention. Therefore, the polar modulation transmitter according to the first embodiment of the invention shown in FIG. 4 has the function of matching the following two quantities with each other: a quantity of delay of an amplitude-signal path, i.e., the total quantity of delays caused by the variable delay unit 202, digital-to-analog converter (DAC) 107 and low-pass filter (LPF) 108; and a quantity of delay of a phase-signal path, i.e., the quantity of delay caused by the phase modulator (PMMOD) 109. The quantity of delay attributed to the delay-calibrating unit 201 on the amplitude-signal path is set to be a remarkably smaller value in comparison to the total quantity of delays caused by the variable delay unit 202, digital-to-analog converter (DAC) 107 and low-pass filter (LPF) 108. The low-pass filter (LPF) 108 has the function of reducing quantization noise and operating noise in outputs of the digital-to-analog converter (DAC) 107.

The signal generator 200 generates a signal, such as a triangular wave signal, based on an input clock (not shown). The signal generator 200 includes a counter, a waveform generating ROM, and others. Incidentally, ROM stands for Read Only Memory.

The delay-calibrating unit 201 is supplied with an output 210 of the signal generator 200, an output 211 of the coordinate-rotation-digital-computer (CORDIC) system 106, and an output 212 of the low-pass filter (LPF) 108. During the operation of calibrating the delay of the amplitude-signal path, the delay-calibrating unit 201 calibrates the quantity of delay of the variable delay unit 202 and the cutoff frequency of the low-pass filter (LPF) 108 so that a delay in connection with the amplitude-signal path extending from an input 213 of the variable delay unit 202 to an output 212 of the low-pass filter (LPF) 108, i.e., the amplitude-signal path delay, coincides with a delay caused by the phase modulator (PMMOD) 109, i.e., the phase-signal path delay, in quantity. The details of the structure of the delay-calibrating unit 201 will be described later with reference to FIG. 5.

The variable delay unit 202 adds a delay depending on a control output signal 214 generated by the delay-calibrating unit 201 to the input 213, and then sends the result to the digital-to-analog converter (DAC) 107. The variable delay unit 202 may include e.g., a digital filter, a flip-flop, and a delay circuit array with multiple stages. Further, in the polar modulation transmitter shown in FIG. 4, the cutoff frequency of the low-pass filter (LPF) 108 is calibrated according to a control output signal 215 generated by the delay-calibrating unit 201, whereby the quantity of delay is calibrated. Now, it is noted that in comparison to the calibration of the quantity of delay by the variable delay unit 202, the quantity of delay is calibrated more roughly by means of the calibration of the cutoff frequency of the low-pass filter (LPF) 108.

<<Delay-Calibrating Unit>>
FIG. 5 is diagram showing a structure of the delay-calibrating unit 201 included in the polar modulation transmitter according to the first embodiment of the invention shown in FIG. 4, and connections with other circuits.

As shown in the drawing, the delay-calibrating unit 201 includes: a delay-adjust unit 300; a phase comparator 301; an analog-voltage comparator 302; a reference-voltage source 303; an N-stage flip-flop 304; a digital comparator 305; a switch 306; and a reference-digital-code register 307. The delay-calibrating unit 201 is supplied with an output 210 of the signal generator 200, an output 211 of the coordinate-rotation-digital-computer (CORDIC) system 106, and an output 212 of the low-pass filter (LPF) 108. During the operation of calibrating the delay of the amplitude-signal path, the delay-calibrating unit 201 produces delay control signals 214 and 215 from a signal 210 supplied from the signal generator 200 and the output 212 of the low-pass filter (LPF) 108, and controls the quantity of delay of the variable delay unit 202, and the quantity of delay of the low-pass filter (LPF) 108.

The switch 306 has a signal-select function, and therefore it selects the output 210 of the signal generator 200 in the operation of delay calibration, and otherwise selects the output 211 of the coordinate-rotation-digital-computer (CORDIC) system 106. The digital comparator 305 is put in action in the operation of delay calibration, and it makes a comparison between the output 210 of the signal generator 200, which is supplied through the switch 306, and a reference code value 312 provided by the reference-digital-code register 307 in magnitude. At a point of time when the output 210 of the signal generator 200 reaches or exceeds the reference code value 312 of the reference-digital-code register 307, the output 313 of the digital comparator 305 is changed from Low level "0" to High level "1". The output 313 of the digital comparator 305 is supplied to the N-stage flip-flop 304, which delays the signal by N clocks thereby to produce a delay output 314. The delay output 314 is fed to one input terminal of the phase comparator 301, and used as a reference signal in the operation of delay calibration. Now, it is noted that the reference code value 312 of the reference-digital-code register 307 is set to a digital value so that the output voltage level of the low-pass filter (LPF) 108 is made equal to a reference voltage 310 (Vref) output by the reference-voltage source 303 at a time when an input is supplied to the digital-to-analog converter (DAC) 107. The quantity of delay of the N-stage flip-flop 304 is set to a value derived by rounding a delay caused by the phase modulator (PMMOD) 109 with a cycle of a clock signal.

The analog-voltage comparator 302 receives the constant reference voltage 310 (Vref) output by the reference-voltage source 303, and compares the voltage level of the output 212 of the low-pass filter (LPF) 108 with the reference voltage 310 (Vref). At a point of time when the voltage level of the output 212 of the low-pass filter (LPF) 108 exceeds the reference voltage 310 (Vref), an output 311 of the analog-voltage comparator 302 is changed from Low level "0" to High level "1". The phase comparator 301 detects a phase difference between the output 311 of the analog-voltage comparator 302 and the delay output 314 of the N-stage flip-flop 304, which is used as a reference signal, and thus provides a phase-difference-detection signal 315 for the input of the delay-adjust unit 300. The phase comparator 301 may be composed of a digital phase comparator with a logic circuit incorporated therein, or an analog phase comparator using an analog multiplier based on, e.g., a Gilbert cell.

The delay-adjust unit 300 detects a quantity of difference between the phase-difference-detection signal 315 from the phase comparator 301, and a phase of a convergence target, and accumulates results of the detection. Then, in order to control the quantity of delay of the amplitude-signal path based on the result of the accumulation, the delay-adjust unit 300 generates delay control signals 214 and 215 and controls the quantity of delay of the variable delay unit 202, and the cutoff frequency of the low-pass filter (LPF) 108. At end of the operation of delay calibration, the values of the delay control signals 214 and 215 are stored in a register or the like inside the delay-adjust unit 300.

<<Operation of Delay Calibration>>

FIG. 6 is a diagram for explaining the operation of delay calibration by the polar modulation transmitter according to the first embodiment of the invention shown in FIGS. 4 and 5.

In the example shown in FIG. 6, a triangular wave signal (sawtooth wave signal) is output as the output 210 of the signal generator 200. However, another periodic signal may be used instead.

In the operation of delay calibration, a triangular wave signal 210 generated by the signal generator 200 is passed through the switch 306 to the digital comparator 305, and the variable delay unit 202 is supplied with the triangular wave signal 213. The digital comparator 305 compares the triangular wave signal 210 with the reference code 312 output by the reference-digital-code register 307. The digital comparator 305 generates, its output, a square-wave output 313 which is characterized by a rising edge arising at time when the triangular wave signal 210 reaches the reference code 312 in the course of rising, and a falling edge arising at time when the triangular wave signal 210 falls.

The square-wave output 313 is delayed by the N-stage flip-flop 304 thereby to make the delay output 314, which is supplied to one input terminal of the phase comparator 301 and used as a reference signal in the operation of delay calibration. On the other hand, the triangular wave signal 213 provided to the variable delay unit 202, is delayed there, converted into an analog signal by the digital-to-analog converter (DAC) 107, has an alias component filtered out by the low-pass filter (LPF) 108 to make a delay triangular wave signal 212, and then is fed back to the analog-voltage comparator 302 in the delay-calibrating unit 201.

The analog-voltage comparator 302 compares the delay triangular wave signal 212 with the reference voltage 310 (Vref) to output a square-wave signal 311. The square-wave signal 311 is characterized by a rising edge arising at time when the delay triangular wave signal 212 reaches the reference voltage 310 (Vref) in the course of rising, and a falling edge arising at time when the delay triangular wave signal 212 falls, as shown in FIG. 6. The square-wave signal 311 and the delay output 314 used as a reference signal in the operation of delay calibration are supplied to the phase detector 301. Thus, a phase-difference-detection signal 315 corresponding to the phase difference between the signals 311 and 314 is produced and output by the phase detector 301, and supplied to an input of the delay-adjust unit 300.

The delay-adjust unit 300 makes a comparison between a difference delay value derived from the subtraction of the quantity of delay of the phase modulator (PMMOD) 109 from the quantity of delay of the N-stage flip-flop 304, and the phase difference of the phase-difference-detection signal 315. If the phase difference of the phase-difference-detection signal 315 is larger than the difference delay value, the delay control signal 214 rises, and the quantity of delay of the variable delay unit 202 increases. In addition, if the phase difference of the phase-difference-detection signal 315 of the phase detector 301 is larger than the difference delay value, the delay control signal 215 rises, whereby the cutoff frequency of the low-pass filter (LPF) 108 is lowered, and the quantity of delay of the low-pass filter (LPF) 108 is increased.

In addition, as an analog voltage resulting from the conversion of the reference code 312 of the reference-digital-code register 307 by the digital-to-analog converter (DAC) 107 is set to be equal to the reference voltage 310 (Vref) of the reference-voltage source 303, the quantity of delay caused by a combination of the variable delay unit 202, the digital-to-analog converter (DAC) 107 and the low-pass filter (LPF) 108 can be detected by the phase comparator 301 detecting the phase-difference-detection signal 315 corresponding to the phase difference between the square-wave signal output 311 of the analog-voltage comparator 302, and the delay output 314 in the operation of delay calibration, which is used as a reference signal. In short, a difference delay value resulting from the subtraction of the phase difference of the phase-difference-detection signal 315 from the quantity of delay of the N-stage flip-flop 304 represents the quantity of delay of the combination of the variable delay unit 202, the digital-to-analog converter (DAC) 107 and the low-pass filter (LPF) 108. Therefore, for the coincidence between this quantity of delay and the quantity of delay of the phase modulator (PM-MOD) 109, the cutoff frequency of the low-pass filter (LPF) 108 and the quantity of delay of the variable delay unit 202 are controlled so that a difference delay value resulting from the subtraction of the quantity of delay of the phase modulator (PMMOD) 109 from the quantity of delay of the N-stage flip-flop 304 is equal to the phase difference of the phase-difference-detection signal 315. The operation of delay calibration is carried out in this way.

In reality, as a difference delay value resulting from the subtraction of the phase difference of the phase-difference-detection signal 315 from the quantity of delay of the N-stage flip-flop 304 is set to be an extremely small value, the phase difference of the phase-difference-detection signal 315 also takes an extremely small value. Therefore, the quantity of delay of the combination of the variable delay unit 202, the digital-to-analog converter (DAC) 107, and the low-pass filter (LPF) 108 is controlled by the delay control signals 214 and 215 so that the phase of the delay output 314 depending on the quantity of delay of the N-stage flip-flop 304 and used as a reference signal in the operation of delay calibration synchronizes with the phase of the square-wave signal output 311 of the analog-voltage comparator 302.

<<Another Delay-Calibrating Unit>>

Figure 7:
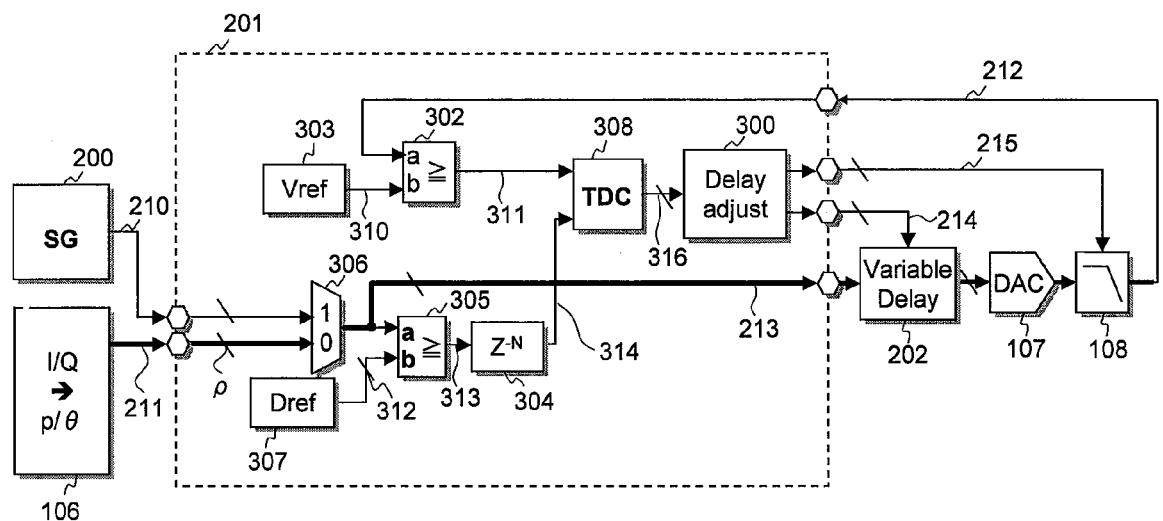
FIG. 7 is a diagram showing a structure of a modification of the delay-calibrating unit 201 included in the polar modulation transmitter according to the first embodiment of the invention shown in FIG. 4, and its connections with other circuits.

FIG. 7 is a diagram showing a structure of a modification of the delay-calibrating unit 201 included in the polar modulation transmitter according to the first embodiment of the invention shown in FIG. 4, and its connections with other circuits.

The delay-calibrating unit 201 shown in FIG. 7 is different from the delay-calibrating unit 201 shown in FIG. 5 in that the delay-calibrating unit 201 shown in FIG. 7 includes a time-to-digital converter (TDC) 308 instead of the phase comparator 301 included in the delay-calibrating unit 201 shown in FIG. 5, and an output from the time-to-digital converter (TDC) 308 is supplied to the input to the delay-adjust unit 300. TDC 308 is supplied with two input signals at two input terminals, and converts the difference in input time between the two input signals into a digital output 316. The digital output 316 is a value which has been rounded according to the resolution of the time-to-digital converter (TDC) 308. In this step, if the resolution of the time-to-digital converter (TDC) 308 is equal to a unit delay time of the variable delay unit 202, or they are in a relation such that one of them is a multiple of the other, the quantity of delay of the variable delay unit 202 can be directly determined by the digital output, which is a result of detection, 316 by the time-to-digital converter (TDC) 308, whereby a high-speed delay calibration is enabled.

<<Influence of Variations in Circuits>>

Figure 8:
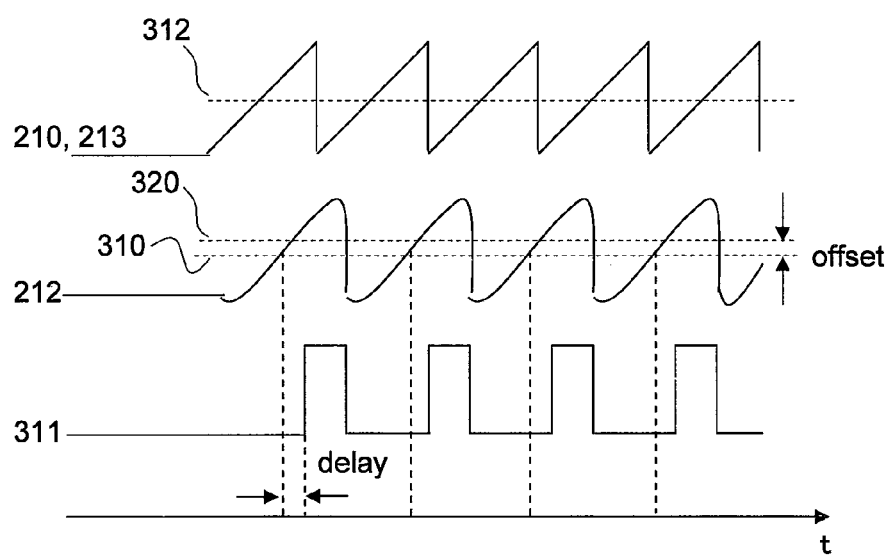
FIG. 8 is a diagram showing the influence of an offset applied to the analog-voltage comparator 302, which is included in the delay-calibrating unit 201 of the polar modulation transmitter according to the first embodiment of the invention as shown in FIGS. 4, 5 and 7, on the output 311 thereof.

FIG. 8 is a diagram showing the influence of an offset applied to the analog-voltage comparator 302, which is included in the delay-calibrating unit 201 of the polar modulation transmitter according to the first embodiment of the invention as shown in FIGS. 4, 5 and 7, on the output 311 thereof.

As shown in the drawing, with an offset put on the analog-voltage comparator 302, the square-wave signal 311 rises not at time when the delay triangular wave signal 212 reaches the reference voltage 310 (Vref) in the course of rising, but at a time when the delay triangular wave signal 212 reaches a voltage 320 which represents the reference voltage 310 (Vref) plus the offset. The delay-calibrating unit 201 detects the timing of rising of the square-wave signal 311, and then detects the delay of the amplitude-signal path. Therefore, with a large offset applied to the analog-voltage comparator 302, the accuracy of calibration of delay of the amplitude-signal path is worsened, which deteriorates the adjacent channel leakage power ratio (ACPR) and the error vector magnitude (EVM).

Figure 9:
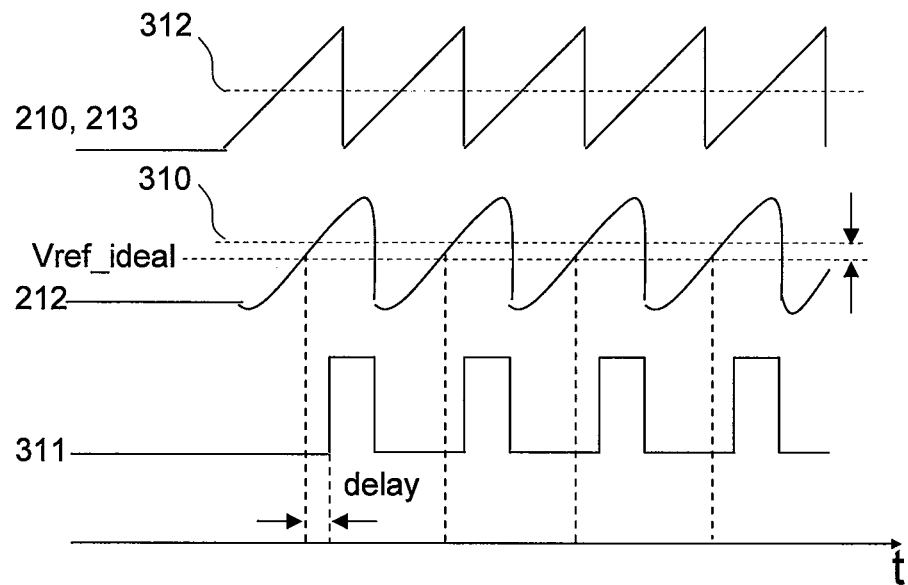
FIG. 9 is a diagram showing the influence of the variation in the output voltage 310 (Vref) of the reference-voltage source 303, which is included in the delay-calibrating unit 201 of the polar modulation transmitter according to the first embodiment of the invention as shown in FIGS. 4, 5 and 7, on the output 311 of the analog-voltage comparator 302.

FIG. 9 is a diagram showing the influence of the variation in the output voltage 310 (Vref) of the reference-voltage source 303, which is included in the delay-calibrating unit 201 of the polar modulation transmitter according to the first embodiment of the invention as shown in FIGS. 4, 5 and 7, on the output 311 of the analog-voltage comparator 302.

In the example shown in FIG. 9, the reference voltage 310 (Vref) is larger than an ideal value. The increase of the reference voltage 310 delays the time at which the delay triangular wave signal 212 reaches the reference voltage 310 (Vref) in the course of rising. Therefore, the timing of rising of the square-wave signal 311 is delayed in comparison to a condition where there are no variations in the reference voltage 310. As a result, the quantity of delay caused by the combination of the variable delay unit 202, the digital-to-analog converter (DAC) 107 and the low-pass filter (LPF) 108 is detected as being larger than that of an actual delay, and the accuracy of calibration of delay of the amplitude-signal path is deteriorated as already described concerning the influence of the offset with reference to FIG. 8. In the case of the reference voltage 310 (Vref) below the ideal value, the timing of rising of the square-wave signal 311 is made faster. As a result, the quantity of delay caused by the combination of the variable delay unit 202, the digital-to-analog converter (DAC) 107 and the low-pass filter (LPF) 108 is detected as being smaller than that of an actual delay, and the accuracy of calibration of delay of the amplitude-signal path is deteriorated as expected.

Figure 10:
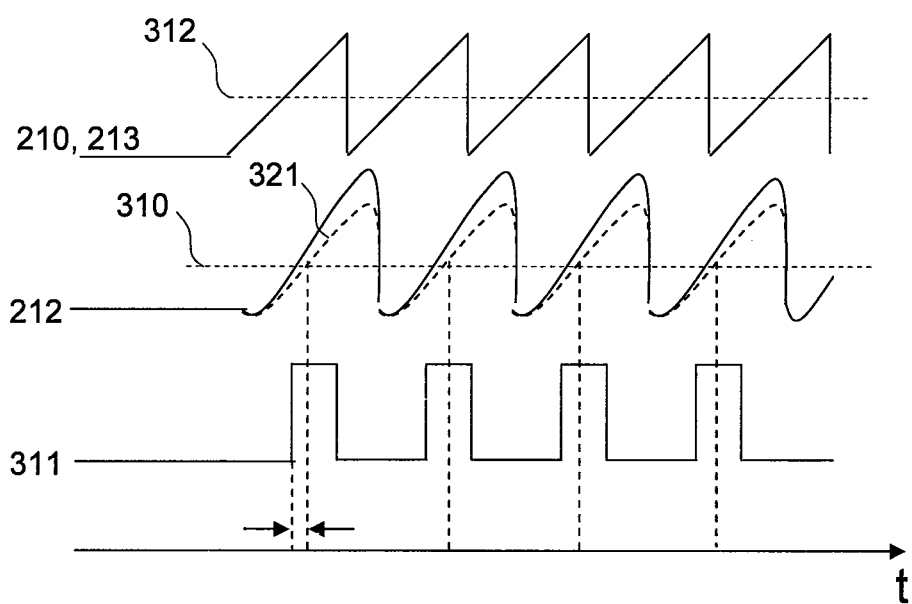
FIG. 10 is a diagram showing the influence of variations in gain of the digital-to-analog converter (DAC) 107 and low-pass filter (LPF) 108, both included in the polar modulation transmitter according to the first embodiment of the invention as shown in FIGS. 4, 5 and 7, on the output 311 of the analog-voltage comparator 302.

FIG. 10 is a diagram showing the influence of variations in gain of the digital-to-analog converter (DAC) 107 and low-pass filter (LPF) 108, both included in the polar modulation transmitter according to the first embodiment of the invention as shown in FIGS. 4, 5 and 7, on the output 311 of the analog-voltage comparator 302.

In the example shown in FIG. 10, the gain of the digital-to-analog converter (DAC) 107 and low-pass filter (LPF) 108 is larger than a design value. As shown in the drawing, with the gain of the digital-to-analog converter (DAC) 107 and low-pass filter (LPF) 108 larger than the design value, the delay triangular wave signal 212 crosses the reference voltage 310 (Vref) earlier than the delay triangular wave signal 321 under the condition of no variations in the gain does. As a result, in comparison to the timing in the case of no variations in the gain, the timing of rising of the square-wave signal 311 is earlier, and the quantity of delay caused by the combination of the variable delay unit 202, digital-to-analog converter (DAC) 107, and low-pass filter (LPF) 108 is detected as being smaller than that of an actual delay. In contrast, if the gain of the digital-to-analog converter (DAC) 107 and low-pass filter (LPF) 108 is smaller than the design value, the rising of the square-wave signal 311 is delayed in comparison to the timing in the case of no variations in the gain. As a result, the quantity of delay caused by the combination of the variable delay unit 202, digital-to-analog converter (DAC) 107 and low-pass filter (LPF) 108 is detected as being larger than that of an actual delay.

Figure 11:
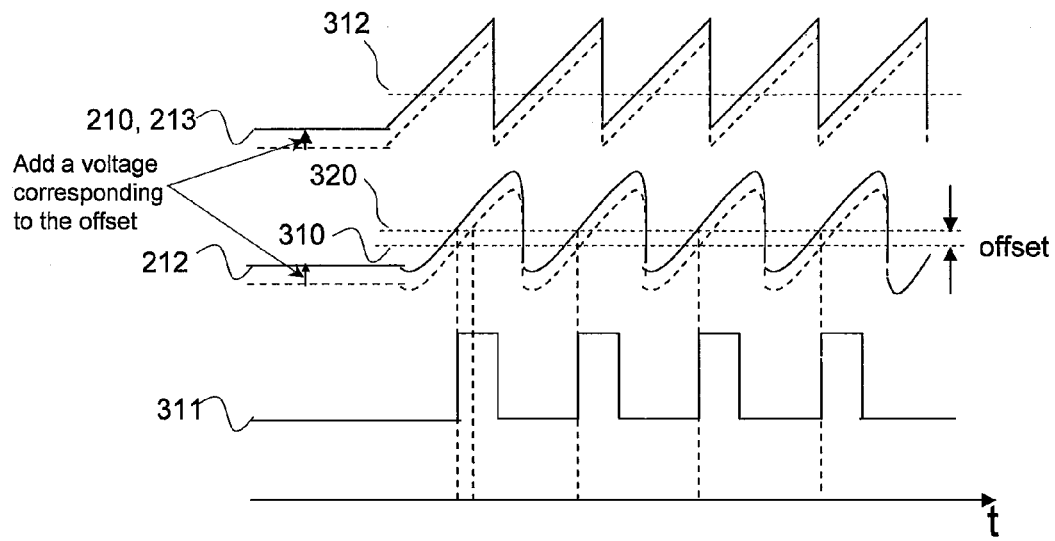
FIG. 11 is a diagram for explaining that the influence of an off set of the analog-voltage comparator 302, which is included in the delay-calibrating unit 201 of the polar modulation transmitter according to the first embodiment of the invention as shown in FIGS. 4, 5 and 7, can be cancelled out by the level change of the output 210 of the signal generator 200, the triangular wave signal 213 supplied to the input of the variable delay unit 202, and the delay triangular wave signal 212, and the level change 320 of the reference voltage 310 (Vref)

As described above with reference to FIGS. 8 to 10, the following three factors vary the timing of rising of the output square-wave signal 311 of the analog-voltage comparator 302 to which the delay triangular wave signal 212 is supplied, and change the quantity of delay caused by the combination of the variable delay unit 202, digital-to-analog converter (DAC) 107 and low-pass filter (LPF) 108 from that of an actual delay: the offset of the analog-voltage comparator 302; variations in the reference voltage 310 (Vref) of the reference-voltage source 303; and variations in gain of the digital-to-analog converter (DAC) 107 and low-pass filter (LPF) 108. However, the influences of these variations can be canceled out by using a change produced under the influences of the variations to change the level of the delay triangular wave signal 212, and to synchronize an actual timing at which the delay triangular wave signal 212 crosses the reference voltage 310 (Vref) with an ideal timing. For instance, a voltage corresponding to the offset of the analog-voltage comparator 302 is added to the triangular wave signal 213 supplied to the input of the variable delay unit 202, whereby the delay triangular wave signal 212 can be changed in level by the voltage corresponding to the offset of the analog-voltage comparator 302. With the intention like this, the voltage corresponding to the offset is added to the output 210 of the signal generator 200, and the triangular wave signal 213 supplied to the input of the variable delay unit 202, as shown in FIG. 11. Incidentally, FIG. 11 is a diagram for explaining that the influence of an off set of the analog-voltage comparator 302, which is included in the delay-calibrating unit 201 of the polar modulation transmitter according to the first embodiment of the invention as shown in FIGS. 4, 5 and 7, can be cancelled out by means of level changes of the output 210 of the signal generator 200, the triangular wave signal 213 supplied to the input of the variable delay unit 202, and the delay triangular wave signal 212, and the level change 320 of the reference voltage 310 (Vref).

Specifically, the voltage corresponding to the off set of the analog-voltage comparator 302 is used to set level changes of: the output 210 of the signal generator 200; the triangular wave signal 213 supplied to the input of the variable delay unit 202; and the delay triangular wave signal 212, as shown in FIG. 11. Further, as shown in FIG. 11, a level change from the reference voltage 310 (Vref) to the reference voltage 320 is set by use of the voltage corresponding to the offset of the analog-voltage comparator 302. In this way, the change in the rising timing of the output square-wave signal 311 of the analog-voltage comparator 302 can be compensated by using the analog-voltage comparator 302 to make a comparison between the delay triangular wave signal 212 after the level change, and the reference voltage 320 after the level change. Now, it is noted that as the reference voltage 310 (Vref) is changed, in level, to the reference voltage 320, the value of the reference code 312 of the reference-digital-code register 307 is varied from a digital value corresponding to the reference voltage 310 (Vref) to a digital value corresponding to the reference voltage 320.

<<Improved Delay-Calibrating Unit>>

Figure 12:
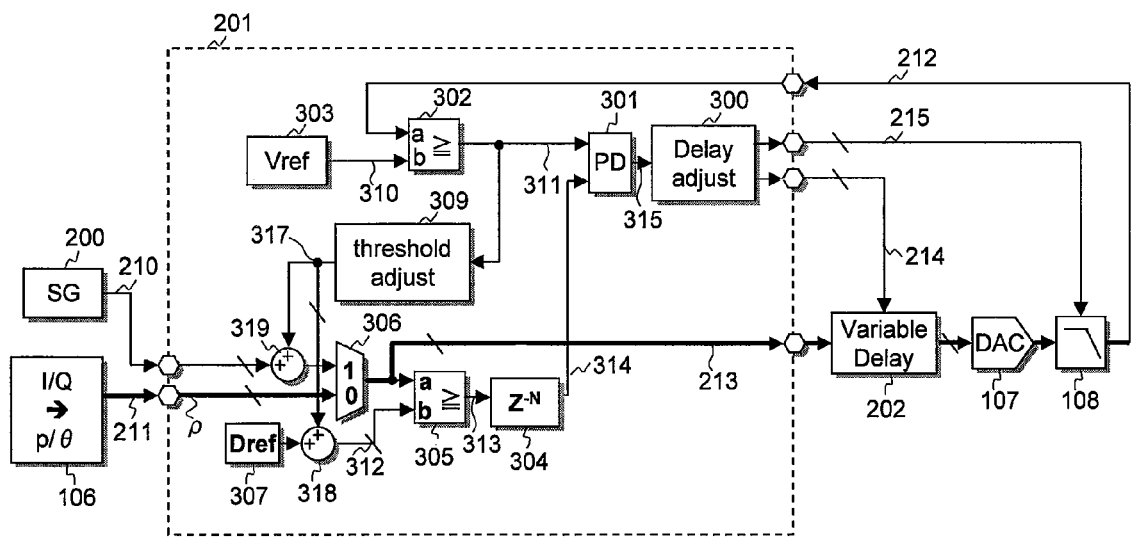
FIG. 12 is a diagram showing a structure of an improved delay-calibrating unit 201 included in the polar modulation transmitter according to the first embodiment of the invention shown in FIG. 4, and connections with other circuits.

FIG. 12 is a diagram showing a structure of an improved delay-calibrating unit 201 included in the polar modulation transmitter according to the first embodiment of the invention shown in FIG. 4, and connections with other circuits.

Unlike the delay-calibrating unit 201 shown in FIG. 5, the improved delay-calibrating unit 201 shown in FIG. 12 has a threshold-adjust unit 309 and adders 318 and 319 additionally provided therein, which the delay-calibrating unit 201 shown in FIG. 5 does not include.

In the improved delay-calibrating unit 201 shown in FIG. 12, the threshold-adjust unit 309 generates a compensating-offset signal 317 based on the offset of the analog-voltage comparator 302 and according to variations of the reference voltage 310 (Vref), and gain variations of the digital-to-analog converter (DAC) 107 and low-pass filter (LPF) 108. The signal 210 from the signal generator 200, and the compensating-offset signal 317 from the threshold-adjust unit 309 are supplied to one input terminal of the adder 319 and the other input terminal, respectively. As a result, the signal 210 is changed in level in the adder 319, and the signal 210 thus changed in level is output through the output terminal of the adder 319 to one input terminal of the switch 306. The reference code from the reference-digital-code register 307, and the compensating-offset signal 317 from the threshold-adjust unit 309 are supplied to one input terminal of the adder 318, and the other input terminal, respectively. As a result, the reference code 312 is changed in level in the adder 318, and the signal 312 thus changed in level is output through the output terminal of the adder 318 to the other input terminal of the digital comparator 305.

Using the polar modulation transmitter according to the first embodiment of the invention shown in FIG. 4, which includes the improved delay-calibrating unit 201 shown in FIG. 12, the fluctuation in the rising timing of the output square-wave signal 311 of the analog-voltage comparator 302 can be compensated even if there are three types of factors: the offset of the analog-voltage comparator 302, variations of the reference voltage 310 (Vref) of the reference-voltage source 303, and gain variations of the digital-to-analog converter (DAC) 107 and low-pass filter (LPF) 108. Therefore, using the polar modulation transmitter according to the first embodiment of the invention shown in FIG. 4, which includes the improved delay-calibrating unit 201 shown in FIG. 12, it becomes possible to lighten the degree to which the variations of circuits deteriorate the accuracy of calibration of delay of the amplitude-signal path.

<<Threshold-Adjust Unit of the Improved Delay-Calibrating Unit>>

Figure 13:
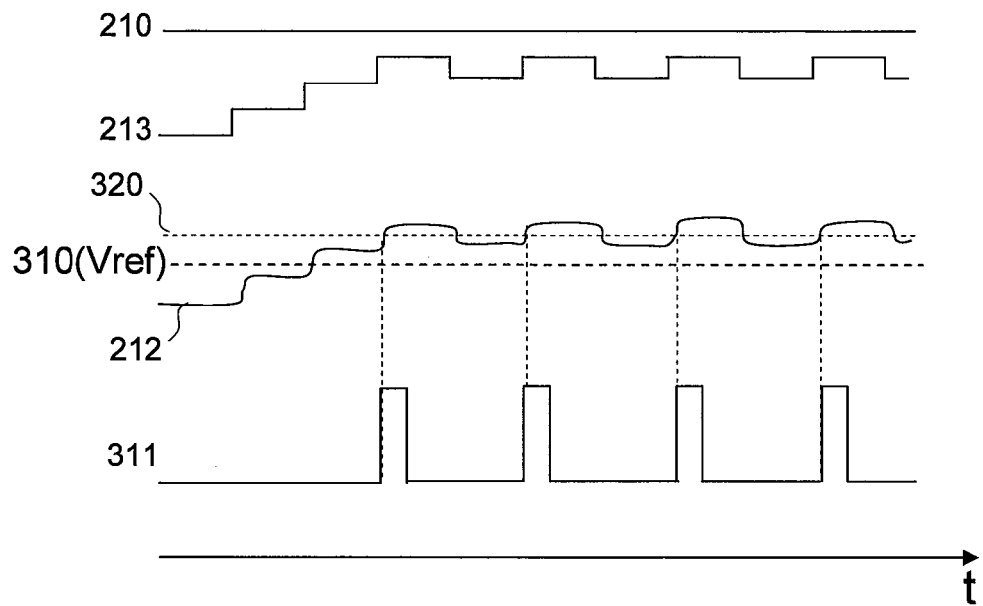
FIG. 13 is a diagram for explaining an operation of the threshold-adjust unit 309 of the improved delay-calibrating unit 201 shown in FIG. 12, which is included in the polar modulation transmitter according to the first embodiment of the invention shown in FIG. 4.

FIG. 13 is a diagram for explaining an operation of the threshold-adjust unit 309 of the improved delay-calibrating unit 201 shown in FIG. 12, which is included in the polar modulation transmitter according to the first embodiment of the invention shown in FIG. 4.

The output 210 of the signal generator 200 is fixed to a level of zero as shown in FIG. 13, and the analog-voltage comparator 302 is supplied with an offset-adding reference voltage 320 from the reference-voltage source 303, and a delay triangular wave signal 212 output by the low-pass filter (LPF) 108. In a period of time during which the level of the delay triangular wave signal 212 output by the low-pass filter (LPF) 108 is below the offset-adding reference voltage 320, the output square-wave signal 311 of the analog-voltage comparator 302 stays at Low level "0". In this condition, the threshold-adjust unit 309 raises the compensating-offset signal 317, and thus the level of the triangular wave signal 213 supplied to the input of the variable delay unit 202 is likewise increased. The delay triangular wave signal 212 output by the low-pass filter (LPF) 108 is raised with an increase of the triangular wave signal 213 resulting from the rise of the compensating-offset signal 317. At a time when the delay triangular wave signal 212 exceeds the offset-adding reference voltage 320 of the analog-voltage comparator 302 consequently, the output square-wave signal 311 of the analog-voltage comparator 302 is turned to High level "1". After the output square-wave signal 311 is changed to High level "1", the threshold-adjust unit 309 lowers the compensating-offset signal 317. As a result, the triangular wave signal 213 is reduced in level. After iteration of the operation as described above, the value of the compensating-offset signal 317 generated by the threshold-adjust unit 309 is converged. The threshold-adjust unit 309 holds the value of the compensating-offset signal 317 thus converged in a register thereinside until the next operation, and supplies, during the period of the operation of delay calibration, the compensating-offset signal 317 to the other input terminals of the adder 318 and adder 319.

<<PLL Serving as the Phase Modulator>>

FIG. 14 is a diagram showing a structure of a phase-locked loop (PLL) serving as the phase modulator (PMMOD) 109 included in the polar modulation transmitter according to the first embodiment of the invention shown in FIG. 4.

Like a PLL as described in JP-A-2006-311489, the phase-locked loop (PLL) used as the phase modulator (PMMOD) 109 included in the polar modulation transmitter according to the first embodiment of the invention shown in FIG. 4 has the following parts as shown in FIG. 14: a phase comparator (PD) 401; a charge pump (CP) 405; a loop filter 400; a voltage-controlled oscillator (VCO) 402; a counter 403; an integrator 404, denoted as "Accumulator"; a charge-pump-current controller 406; a down-conversion mixer (DCM) 407; a synthesizer 408; a variable divider 409; a sigma delta modulator (ΣΔ) 411; a switch 410; and a reference-frequency signal source 412.

With the phase-locked loop (PLL) shown in FIG. 14, in a transmit operation mode of the polar modulation transmitter according to the first embodiment of the invention shown in FIG. 4, a transmit intermediate-frequency signal supplied by the reference-frequency signal source 412 is selected by the switch 410, and provided to the second input terminal IN-2 of the phase comparator (PD) 401, whereas a negative feedback intermediate-frequency signal output by the down-conversion mixer (DCM) 407 is fed to the first input terminal IN-1 of the phase comparator (PD) 401. The transmit intermediate-frequency signal supplied to the second input terminal IN-2 of the phase comparator (PD) 401 contains a phase component (θ) generated by the coordinate-rotation-digital-computer (CORDIC) system 106 of the polar modulation transmitter shown in FIG. 4. The loop filter 400 is charged and discharged by charge/discharge current of the charge pump (CP) 405 connected to the output of the phase comparator (PD) 401, and an oscillation-control voltage which decides the oscillation frequency is supplied from the loop filter 400 to an oscillation-control-input terminal of the voltage-controlled oscillator (VCO) 402. The voltage-controlled oscillator (VCO) 402 generates a transmit RF signal, and outputs the signal through its output terminal. Then, the transmit RF signal is supplied to the mixer 110 connected to the input of the power amplifier (PA) 102 of the polar modulation transmitter shown in FIG. 4. As a matter of course, the transmit RF signal contains a phase component (θ), which is produced by the coordinate-rotation-digital-computer (CORDIC) system 106. On receipt of supply of the transmit RF signal from the voltage-controlled oscillator (VCO) 402, and the reference RF signal from the synthesizer 408 through its two input terminals, the down-conversion mixer (DCM) 407 produces a negative feedback intermediate-frequency signal. The negative feedback intermediate-frequency signal output from the output terminal of the down-conversion mixer (DCM) 407 is supplied to the first input terminal IN-1 of the phase comparator (PD) 401.

In the operation of delay calibration of the polar modulation transmitter according to the first embodiment of the invention shown in FIG. 4, the operation of calibrating a transfer function (the quantity of delay) of the phase-locked loop (PLL) shown in FIG. 14 is carried out following a procedure as described below.

First of all, in the calibrating operation, a division output signal supplied by the variable divider 409 is selected by the switch 410, and then provided to the second input terminal IN-2 of the phase comparator (PD) 401.

Initially, a relatively large fixed value is supplied from the ΣΔ modulator 411 to a division-control input terminal of the variable divider 409, whereby a relatively large division factor is set on the variable divider 409. Thus, the reference RF signal from the synthesizer 408 is divided with the relatively large division factor of the variable divider 409, and a division output signal having a relatively low fixed frequency is supplied from the variable divider 409 to the second input terminal IN-2 of the phase comparator (PD) 401 through the switch 410. In this condition, the phase-locked loop (PLL) shown in FIG. 14 starts a lock operation, in which the voltage-controlled oscillator (VCO) 402 oscillates to emit a transmit RF signal having a relatively low frequency. In the lock operation, in response to the transmit RF signal having a relatively low frequency from the voltage-controlled oscillator (VCO) 402 of the PLL, the counter 403 counts sampling clocks (not shown), whereas the integrator (accumulator) 404 integrates a count value of the counter 403.

Next, a relatively small fixed value is supplied from the ΣΔ modulator 411 to the division-control input terminal of the variable divider 409, whereby a relatively small division factor is set on the variable divider 409. Thus, the reference RF signal from the synthesizer 408 is divided with the relatively small division factor of the variable divider 409, and the division output signal having a relatively high fixed frequency is supplied from the variable divider 409 to the second input terminal IN-2 of the phase comparator (PD) 401 through the switch 410. Then, the phase-locked loop (PLL) shown in FIG. 14 starts a transient operation, in which the transmit RF signal of the voltage-controlled oscillator (VCO) 402 is changed from a relatively low frequency to a higher frequency. After that, the voltage-controlled oscillator (VCO) 402 oscillates to emit a transmit RF signal having a fixed high frequency. During the transient operation, in response to the transmit RF signal of the voltage-controlled oscillator (VCO) 402 in the course of change in frequency, the counter 403 counts sampling clocks, and the integrator (accumulator) 404 integrates a count value of the counter 403. Then, errors of the loop gain and delay of the phase-locked loop (PLL) shown in FIG. 14 with respect to a loop gain and delay required for achieving target properties are calculated by the charge-pump-current controller 406, from the ratio of the count value of the counter 403 in the lock operation of PLL vs. the count value of the counter 403 in the transient operation. To match the PLL loop gain and delay with those fitting for target properties, the charge-pump-current controller 406 calculates correction data. The correction data is supplied from the charge-pump-current controller 406 to the charge pump (CP) 405, and thus it becomes possible to set the charge/discharge current of the charge pump (CP) 405 to a value optimized for matching the PLL loop gain and delay with those fitting for the target properties.

Following the above procedure, the operation of calculating the transfer function (the quantity of delay) of the phase-locked loop (PLL) shown in FIG. 14 is executed. Thus, it becomes possible to match the delay of a phase-locked loop (PLL) serving as the phase modulator (PMMOD) 109 included in the polar modulation transmitter according to the first embodiment of the invention shown in FIG. 4 with the target one.

In an example, the delay of a phase-locked loop (PLL) used as the phase modulator (PMMOD) 109 included in the polar modulation transmitter shown in FIG. 4 is set to a value substantially equal to the delay of the N-stage flip-flop 304 of the delay-calibrating unit 201 shown in FIG. 5 in quantity. Thus, the total quantity of delays caused by the variable delay unit 202, digital-to-analog converter (DAC) 107 and low-pass filter (LPF) 108 is set to a value substantially equal to the delay of the N-stage flip-flop 304 by the operation of calibrating the delay of the amplitude-signal path of the polar modulation transmitter. Further, by the operation of calibrating the delay of the phase-signal path of the polar modulation transmitter, i.e., the operation of calibrating the transfer function of PLL, the delay of a phase-locked loop (PLL) used as the phase modulator (PMMOD) 109 of the polar modulation transmitter is set to be substantially equal to the delay of the N-stage flip-flop 304. As a result, in regard to the polar modulation transmitter shown in FIG. 4, it becomes possible to set the delay of the phase-locked loop (PLL) used as the phase modulator (PMMOD) 109 of the phase-signal path to be substantially equal, in quantity, to the total quantity of delays caused by the variable delay unit 202, digital-to-analog converter (DAC) 107 and low-pass filter (LPF) 108 of the amplitude-signal path.

<<Sequence of the Operation of Delay Calibration>>

FIG. 15 is a diagram showing a sequence of steps of the operation of delay calibration executed in the polar modulation transmitter according to the first embodiment of the invention as described with reference to FIGS. 4, 5, 7, 12 and 14.

The operation of delay calibration which will be described with reference to FIG. 15 includes the steps of: calibrating the delay of the amplitude-signal path; and calibrating the delay of the phase-signal path. As the step of calibrating the delay of the amplitude-signal path and the step of calibrating the delay of the phase-signal path are executed in parallel, the processing time for the operation of delay calibration can be shortened.

As shown in FIG. 15, the polar modulation transmitter is caused to transition from its idle state 1501 to a state of being in the calibrating operation 1502 at power-on of a mobile-phone terminal equipped with the polar modulation transmitter as shown in FIG. 4 and before an operation for transmission using the mobile-phone terminal.

After start of the calibrating operation 1502, the operation of calibrating the delay of the amplitude-signal path, which includes Steps 1503 to 1505, and the operation of calibrating of the delay of the phase-signal path, which includes Steps 1506 and 1507 are executed in parallel.

In Step 1503 for threshold adjustment of the operation of calibrating the delay of the amplitude-signal path, the value of the compensating-offset signal 317 of the threshold-adjust unit 309 included in the improved delay-calibrating unit 201 as described with reference to FIG. 12 is set. After that, in Step 1504 for calibrating the cutoff frequency and delay of the low-pass filter (LPF) 108, and Step 1505 for calibrating the delay of the variable delay unit 202, the delay of the variable delay unit 202, and the cutoff frequency and delay of the low-pass filter (LPF) 108 are controlled by delay control signals 214 and 215 generated by the delay-adjust unit 300 included in the improved delay-calibrating unit 201 as shown in FIG. 12. In this way, the total quantity of delays caused by the variable delay unit 202, digital-to-analog converter (DAC) 107 and low-pass filter (LPF) 108 of the amplitude-signal path of the polar modulation transmitter can be matched with a target value thereof.

In Step 1506 for PLL lock of the operation of calibrating the delay of the phase-signal path, as described with reference to FIG. 14, the ΣΔ modulator 411 sets a larger division factor on the variable divider 409, a division output signal having a lower frequency is supplied from the variable divider 409 through the switch 410 to the second input terminal IN-2 of the phase comparator (PD) 401, and then the phase-locked loop (PLL) starts the lock operation. Consequently, a count integration value in response to a low-frequency transmit RF signal of the voltage-controlled oscillator (VCO) 402 of the PLL during the lock operation can be obtained by the integrator (accumulator) 404.

In Step 1507 for calibrating the transfer function (delay) of PLL of the operation of calibrating the delay of the phase-signal path, as described with reference to FIG. 14, the ΣΔ modulator 411 changes the division factor of the variable divider 409 from the large value to a smaller one, and a count integration value in response to the changing transmit RF signal of the voltage-controlled oscillator (VCO) 402 of the PLL during the transient operation can be gained by the integrator 404. Consequently, the quantity of delay of a phase-locked loop (PLL) used as the phase modulator (PMMOD) 109 of the phase-signal path of the polar modulation transmitter can be matched with the target one.

After completion of the operation of delay calibration, which includes the operation of calibrating the delay of the amplitude-signal path and the operation of calibrating the delay of the phase-signal path, in Step 1508 the polar modulation transmitter according to the first embodiment of the invention as described with reference to FIGS. 4, 5, 7, 12 and 14 starts its transmit operation. According to the transmit operation of Step 1508, satisfactory transmit characteristics in adjacent channel leakage power ratio (ACPR) and error vector magnitude (EVM) can be achieved.

Second Embodiment

FIG. 16 is a diagram showing a structure of a polar modulation transmitter according to the second embodiment of the invention.

The difference between the polar modulation transmitter according to the second embodiment of the invention shown in FIG. 16, and the polar modulation transmitter according to the first embodiment of the invention shown in FIG. 4 will be described below.

The polar modulation transmitter according to the first embodiment of the invention shown in FIG. 4 is based on the first architecture of Polar Modulation system described in the BACKGROUND OF THE INVENTION hereof, in which amplitude and phase components are synthesized by the mixer 110 located before the power amplifier (PA) 102.

In contrast, the polar modulation transmitter according to the second embodiment of the invention shown in FIG. 16 is based on the second architecture of Polar Modulation described in BACKGROUND OF THE INVENTION hereof, in which the output power of the power amplifier (PA) 102 is directly modulated by an amplitude component to synthesize amplitude and phase components.

More specifically, the polar modulation transmitter according to the second embodiment of the invention shown in FIG. 16 does not have the mixer 110, which is included in the polar modulation transmitter as shown in FIG. 4, and includes a regulator 111 instead.

The regulator 111 is connected between a source-voltage line Vdd (not shown) and a source-voltage-supply terminal of the power amplifier (PA) 102. The regulator 111 is supplied with an amplitude component signal having traveled in the amplitude-signal path from the output of the low-pass filter (LPF) 108 through a control input terminal of the regulator 111. The degree of conduction of the regulator 111 is controlled in response to the amplitude component signal at the control input terminal of the regulator 111. Therefore, the voltage level of the operating voltage 212 at the source-voltage-supply terminal of the power amplifier (PA) 102 can be controlled. According to this system, a phase component signal output by the phase modulator (PMMOD) 109 in the phase-signal path of the polar modulation transmitter can be put in a saturated state, and therefore the signal-to-noise ratio (S/N) can be improved, and the power amplifier (PA) 102 can be arranged to be able to work in its saturated state. Hence, the power efficiency of the power amplifier (PA) 102 can be increased. Incidentally, in the case of this system, the output 212 of the low-pass filter (LPF) 108, which is fed back to the delay-calibrating unit 201, is the same as the operating voltage 212 at the source-voltage-supply terminal of the power amplifier (PA) 102. The regulator 111 according to this second architecture of Polar Modulation is a regulator termed an LDO (low dropout) type voltage regulator. A P-channel MOS transistor or a PNP type bipolar transistor is selected for a transistor of the regulator 111. Therefore, a loss of voltage by the transistor of the regulator 111 can be made extremely small by changing the amplitude component signal at the control input terminal of the regulator 111 to Low level and as such, the level of the operating voltage 212 at the source-voltage-supply terminal of the power amplifier (PA) 102 can be raised substantially to the source voltage Vdd.

Third Embodiment

Figure 17:
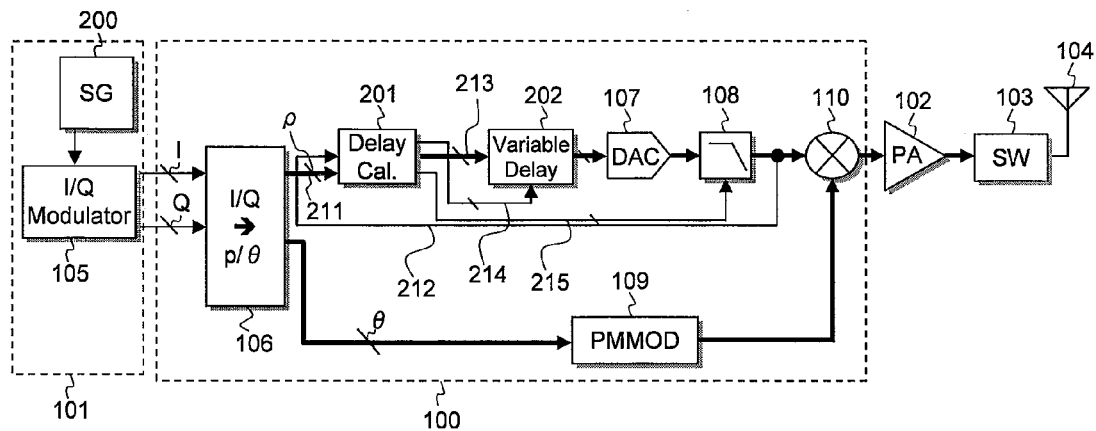
FIG. 17 is a diagram showing a structure of a polar modulation transmitter according to the third embodiment of the invention.

FIG. 17 is a diagram showing a structure of a polar modulation transmitter according to the third embodiment of the invention.

The difference between the polar modulation transmitter according to the third embodiment of the invention shown in FIG. 17, and the polar modulation transmitter according to the first embodiment of the invention shown in FIG. 4 will be described below.

With the polar modulation transmitter according to the third embodiment of the invention shown in FIG. 17, the signal generator 200, which is included in RFIC 100 in the polar modulation transmitter as shown in FIG. 4, is provided in the baseband processor 101. As to the polar modulation transmitter according to the third embodiment of the invention as shown in FIG. 17, in the operation of delay calibration, a signal from the signal generator 200 in the baseband processor 101 is provided to the I/Q signal modulator 105, and I (in-phase) signals and Q (quadrature) signals generated by the I/Q signal modulator 105 are subjected to the conversion by the coordinate-rotation-digital-computer (CORDIC) system 106. Then, an amplitude component signal (ρ) for the calibrating operation resulting from the conversion is supplied to the delay-calibrating unit 201 as an output 211 from the CORDIC system 106.

According to this embodiment, a signal generator 200 can be incorporated in a baseband processor 101, which is faster than an RFIC 100 in the pace of scaling down. Therefore, even in the case of arranging a baseband processor 101 with a waveform generating ROM (Read Only Memory) capable of generating various kinds of test signals built therein, the increase of the footprint of semiconductor chip of the baseband processor 101 can be minimized.

Fourth Embodiment

FIG. 18 is a diagram showing a structure of a polar modulation transmitter according to the fourth embodiment of the invention.

The difference between the polar modulation transmitter according to the fourth embodiment of the invention shown in FIG. 18, and the polar modulation transmitter according to the first embodiment of the invention shown in FIG. 4 will be described below.

The polar modulation transmitter according to the fourth embodiment of the invention shown in FIG. 18 does not have the variable delay unit 202, which is included in the amplitude-signal path of the polar modulation transmitter as shown in FIG. 4, and includes a waveform-equalizer (EQ) 216 instead.

In the polar modulation transmitter shown in FIG. 18, the equalizer 216 is connected to the input terminal of the digital-to-analog converter (DAC) 107. On that account, the equalizer 216 includes a digital filter. In the polar modulation transmitter shown in FIG. 18, each tap coefficient of the digital filter is controlled by a control output signal 214 generated by the delay-calibrating unit 201 for the purpose of using the control output signal 214 to control the delay caused by the equalizer 216 including the digital filter and working as a variable delay unit.

As to the polar modulation transmitter according to the fourth embodiment of the invention shown in FIG. 18, the frequency band of the low-pass filter (LPF) 108 can be narrowed by using the equalizer 216 having a waveform-equalizing function as a variable delay unit. On this account, a filter with a lower order can be used as the low-pass filter (LPF) 108, and therefore the increase of the footprint of semiconductor chip of RFIC 100 can be minimized.

Results of Simulation

Figure 19:
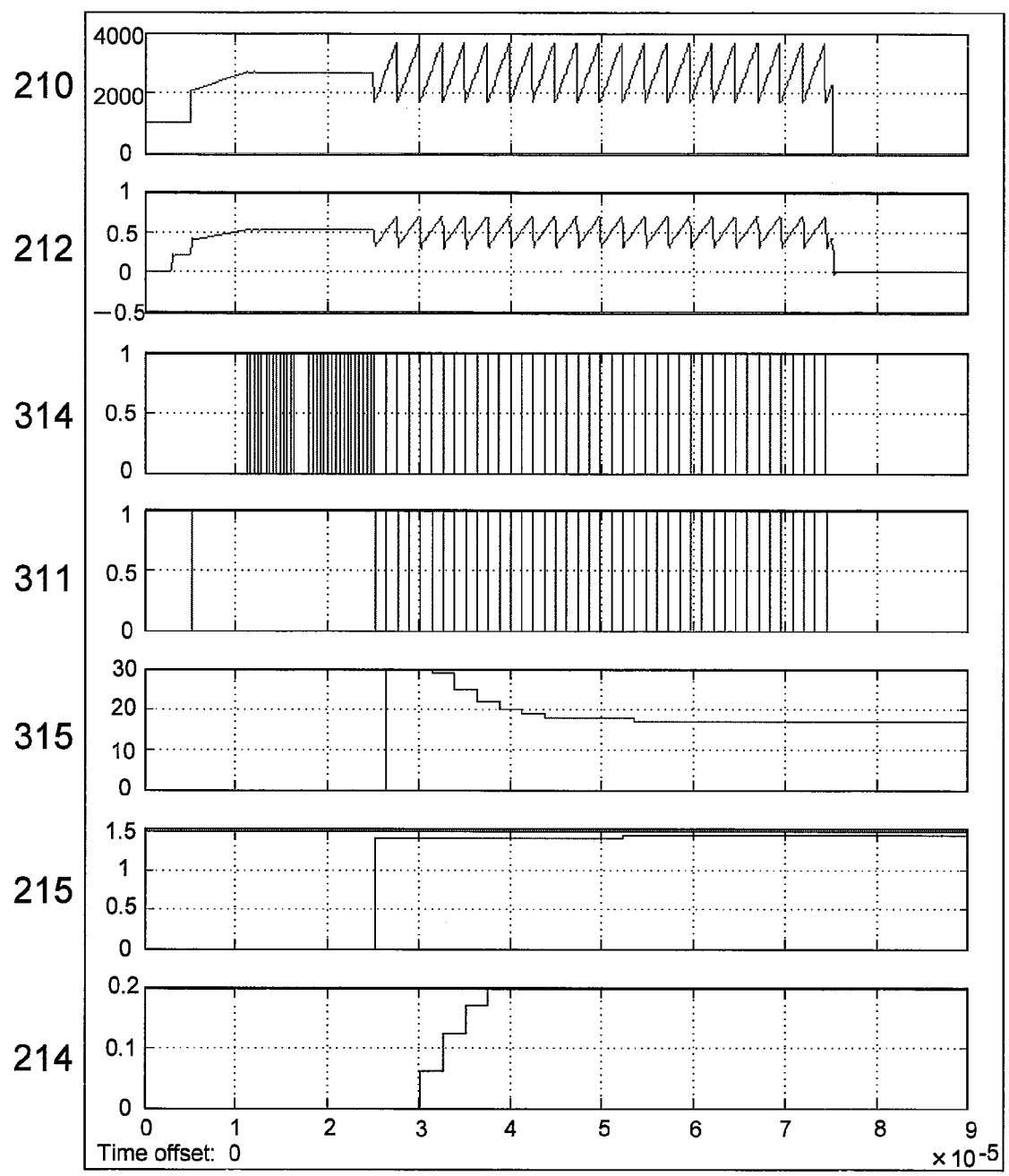
FIG. 19 is a diagram showing results of simulation of waveforms of signals at the parts of the polar transmitter modulator according to the first embodiment of the invention shown in FIGS. 4 and 5.

FIG. 19 is a diagram showing results of simulation of waveforms of signals at the parts of the polar transmitter modulator according to the first embodiment of the invention shown in FIGS. 4 and 5.

Like FIG. 6, FIG. 19 shows signal waveforms of the triangular wave signal 210 of the signal generator 200, delay triangular wave signal 212, reference delay output 314, square-wave signal 311, phase-difference-detection signal 315, delay control signal 215, and delay control signal 214.

Figure 20:
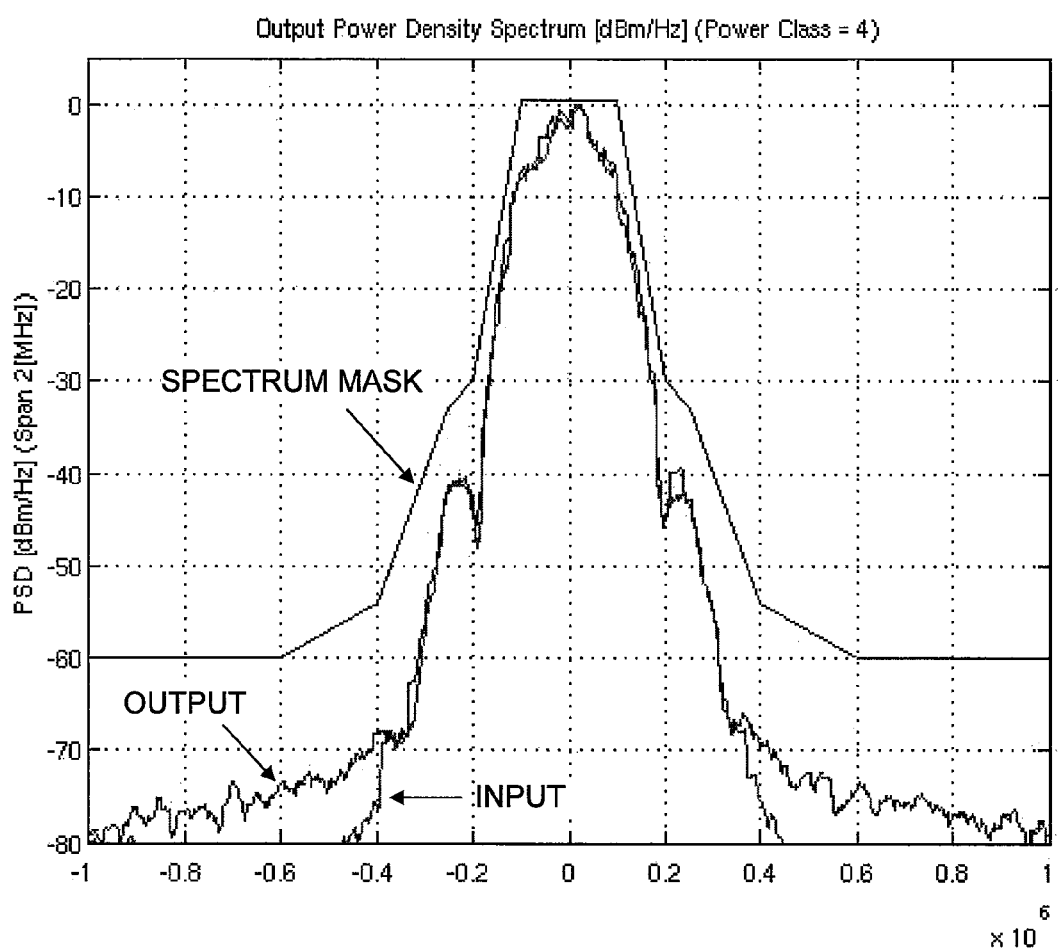
FIG. 20 is a diagram showing results of simulation of input and output spectra in application of the polar transmitter modulator according to the first embodiment of the invention shown in FIGS. 4 and 5 to an EDGE-compliant polar modulation transmitter.

FIG. 20 is a diagram showing results of simulation of input and output spectra in application of the polar transmitter modulator according to the first embodiment of the invention shown in FIGS. 4 and 5 to an EDGE-compliant polar modulation transmitter.

It is seen from the result of simulation shown in FIG. 20 that output spectra of the polar transmitter modulator according to the first embodiment of the invention satisfy a spectrum mask, namely EDGE standard.

Figure 21:
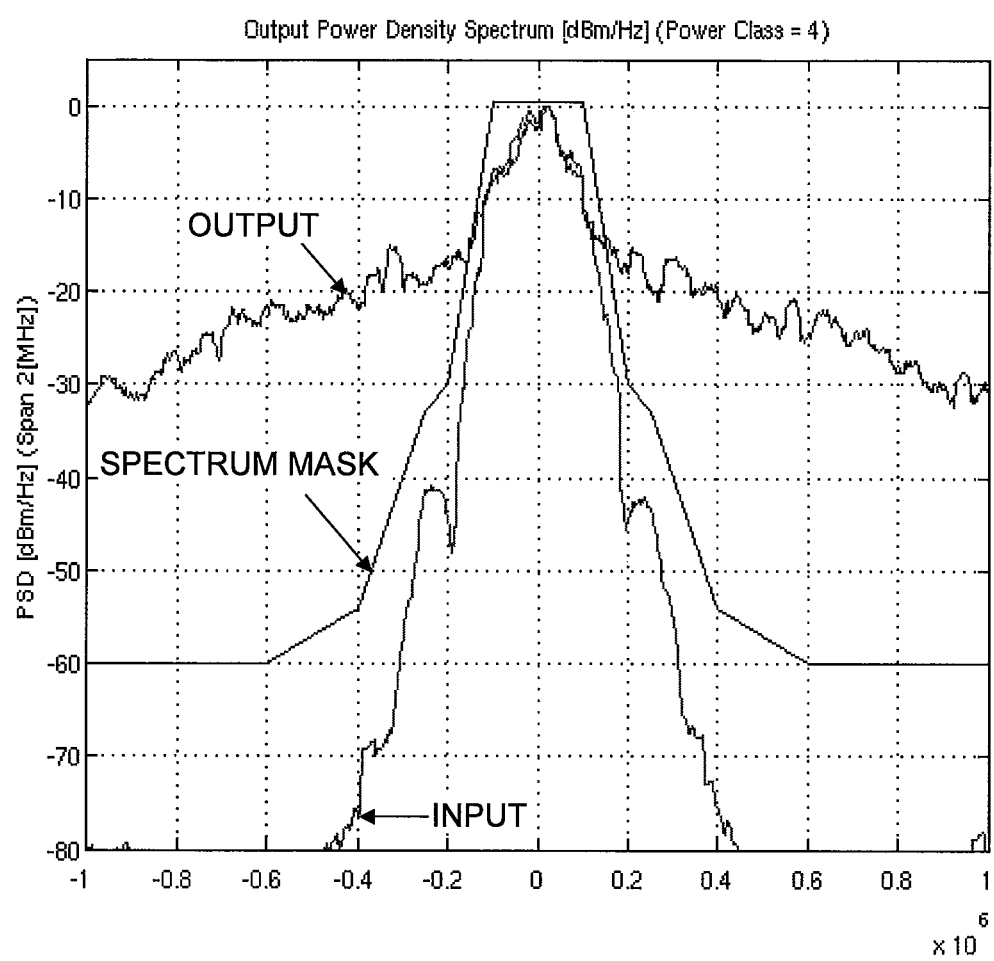
FIG. 21 is a diagram showing results of simulation of input and output spectra in application of the polar transmitter modulator shown in FIG. 1, which had been examined by the inventors prior to the invention, to an EDGE-compliant polar modulation transmitter.

FIG. 21 is a diagram showing results of simulation of input and output spectra in application of the polar transmitter modulator shown in FIG. 1, which had been examined by the inventors prior to the invention, to an EDGE-compliant polar modulation transmitter.

It is seen from the results of simulation shown in FIG. 21 that output spectra of the polar transmitter modulator shown in FIG. 1 cannot meet a spectrum mask, namely EDGE standard.

While the invention made by the inventors has been described above based on the various embodiments specifically, it is not limited to the embodiments. It is obvious that various changes and modifications may be made without departing from the scope thereof.

For instance, in regard to the polar modulation transmitter according to the fourth embodiment of the invention shown in FIG. 18, the equalizer 216 which includes a digital filter and is connected to the input terminal of the digital-to-analog converter (DAC) 107 may be replaced with another equalizer 216 which includes an analog filter and is connected to an output of the digital-to-analog converter (DAC) 107. In this case, a control output signal 214 generated by the delay-calibrating unit 201 is used to control the value of a resistance or capacitance of the equalizer 216 including the analog filter.

What is claimed is:

1. A transmitter operable to synthesize amplitude and phase components, comprising:
    an amplitude-signal path along which the amplitude component is conveyed; and
    a phase-signal path along which the phase component is conveyed,
    wherein the amplitude-signal path includes a delay-calibrating unit, a digital-to-analog converter operable to respond the amplitude component and a low-pass filter supplied with an output of the digital-to-analog converter,
    the phase-signal path includes a phase modulator operable to convert the phase component into a radio frequency component,
    in an operation of delay calibration, the delay-calibrating unit receives a test input signal at an input thereof and provides the test input signal to an input of the digital-to-analog converter,
    in the operation of delay calibration, the delay-calibrating unit detects a delay of a test output signal coming out of an output of the low-pass filter with respect to the test input signal upon receipt of the test output signal, and
    in the operation of delay calibration, the delay-calibrating unit calibrates an amplitude signal delay from the input of the delay-calibrating unit to the output of the low-pass filter in the amplitude-signal path in response to the detected delay of the test output signal, whereby a deference between the amplitude signal delay in the amplitude-signal path and a phase signal delay of the phase modulator in the phase-signal path is reduced,
    wherein in the operation of delay calibration, the test input signal is not provided to the input of the phase modulator of the phase-signal path, the phase modulator has a phase-signal-delay-calibrating function for calibrating the phase signal delay into a predetermined value, and
    in the operation of delay calibration, the phase signal delay of the phase modulator is calibrated into the predetermined value by the phase-signal-delay-calibrating function, and the delay-calibrating unit calibrates the amplitude signal delay in response to the detected delay of the test output signal, so that an operation of calibrating the amplitude signal delay in the amplitude-signal path and an operation of calibrating the phase signal delay in the phase-signal path are executed in parallel, thereby reducing a difference between the amplitude signal delay and the phase signal delay.

2. The transmitter according to claim 1, wherein the phase modulator includes a phase-locked loop including a phase comparator, a charge pump, a loop filter, and a control oscillator, and
    a charge/discharge current of the charge pump operable to charge and discharge the loop filter is adjusted by measuring an oscillation frequency of the control oscillator during a transient response operation of the phase-locked loop constituting the phase modulator, and the phase signal delay of the phase modulator can be calibrated into the predetermined value.

3. The transmitter according to claim 2, further comprising a variable delay circuit connected between an output of the delay-calibrating unit in the amplitude-signal path and the input of the digital-to-analog converter,
    wherein in the operation of delay calibration, the delay-calibrating unit controls, in quantity of delay, the variable delay circuit and the low-pass filter in response to the detected delay of the test output signal, thereby to calibrate the amplitude signal delay from the input of the delay-calibrating unit to the output of the low-pass filter.

4. The transmitter according to claim 3, wherein the delay-calibrating unit includes a register, a digital comparator, a delay logic circuit, a phase comparator, an analog-voltage comparator, and a delay-adjust unit,
    the digital comparator compares the test input signal with a digital value with a reference code set on the register,
    the delay logic circuit generates a reference delay output signal in response to a compare-output signal from the digital comparator,
    the analog-voltage comparator compares the test output signal at the output of the low-pass filter with a reference voltage, thereby to generate a voltage-compare-output signal,
    the phase comparator generates a phase-difference-detection signal in response to the reference delay output signal generated by the delay logic circuit, and the voltage-compare-output signal generated by the analog-voltage comparator,
    the delay-adjust unit generates a first delay control signal for controlling the quantity of delay of the variable delay circuit, and a second delay control signal for controlling the quantity of delay of the low-pass filter in response to the phase-difference-detection signal generated by the phase comparator, and
    a voltage value of the reference voltage can be set to be substantially equal to a voltage value of an analog voltage into which the digital-to-analog converter converts the reference code set on the register.

5. The transmitter according to claim 4, further comprising a signal generator operable to supply the test input signal to the input of the delay-calibrating unit in the operation of delay calibration,
    wherein the signal generator is activated to generate the test input signal at time when power is turned on for an information-communication terminal equipped with the transmitter, and in the operation of delay calibration before a transmit operation by use of the information-communication terminal, which makes it possible to reduce a difference between the amplitude signal delay and phase signal delay.

6. The transmitter according to claim 5, further comprising a digital calculation system operable to convert an in-phase signal and a quadrature signal of an orthogonal coordinate system which can be supplied through a digital interface, thereby to generate the amplitude component and the phase component,
    wherein during the transmit operation, the amplitude component and phase component generated by the digital calculation system can be conveyed through the amplitude-signal path and phase-signal path respectively, and then synthesized, and
    in the operation of delay calibration before the transmit operation, the phase signal delay of the phase modulator is calibrated into the predetermined value by the phase-signal-delay-calibrating function, and in parallel with this, the signal generator is activated to generate the test input signal, whereby the reduction of the difference between the amplitude signal delay and phase signal delay is enabled.

7. The transmitter according to claim 6, further comprising at least one of a mixer and regulator for synthesizing the amplitude component and phase component.

8. The transmitter according to claim 6, wherein the variable delay unit is composed of an equalizer having a waveform-equalizing function.

9. The transmitter according to claim 1, wherein the transmitter is based on a Polar Modulation system and arranged to be capable of coping with both cases where the in-phase and quadrature signals of the orthogonal coordinate system, which can be supplied to the digital calculation system, are in conformity with GSM, and where the in-phase and quadrature signals are in conformity with EDGE.

10. A semiconductor integrated circuit available for a transmitter operable to synthesize amplitude and phase components, comprising:
an amplitude-signal path along which the amplitude component is conveyed; and
a phase-signal path along which the phase component is conveyed,
wherein the amplitude-signal path includes a delay-calibrating unit, a digital-to-analog converter operable to respond the amplitude component and a low-pass filter supplied with an output of the digital-to-analog converter,
the phase-signal path includes a phase modulator operable to convert the phase component into a radio frequency component,
in an operation of delay calibration, the delay-calibrating unit receives a test input signal at an input thereof and provides the test input signal to an input of the digital-to-analog converter,
in the operation of delay calibration, the delay-calibrating unit detects a delay of a test output signal coming out of an output of the low-pass filter with respect to the test input signal upon receipt of the test output signal, and
in the operation of delay calibration, the delay-calibrating unit calibrates an amplitude signal delay from the input of the delay-calibrating unit to the output of the low-pass filter in the amplitude-signal path in response to the detected delay of the test output signal, whereby a deference between the amplitude signal delay in the amplitude-signal path and a phase signal delay of the phase modulator in the phase-signal path is reduced,
wherein in the operation of delay calibration, the test input signal is not provided so the input of the phase modulator of the phase-signal path, the phase modulator has a phase-signal-delay-calibrating function for calibrating the phase signal delay into a predetermined value, and
in the operation of delay calibration, the phase signal delay of the phase modulator is calibrated into the predetermined value by the phase-signal-delay-calibrating function, and the delay-calibrating unit calibrates the amplitude signal delay in response to the detected delay of the test output signal so that an operation of calibrating the amplitude signal delay in the amplitude-signal path and an operation of calibrating the phase signal delay in the phase-signal path are executed in parallel, thereby reducing a difference between the amplitude signal delay and the phase signal delay.

11. The semiconductor integrated circuit according to claim 10, wherein the phase modulator includes of a phase-locked loop including a phase comparator, a charge pump, a loop filter, and a control oscillator, and
a charge/discharge current of the charge pump operable to charge and discharge the loop filter is adjusted by measuring an oscillation frequency of the control oscillator during a transient response operation of the phase-locked loop constituting the phase modulator, and the phase signal delay of the phase modulator can be calibrated into the predetermined value.

12. The semiconductor integrated circuit according to claim 11, further comprising a variable delay circuit connected between an output of the delay-calibrating unit in the amplitude-signal path and the input of the digital-to-analog converter,
wherein in the operation of delay calibration, the delay-calibrating unit controls, in quantity of delay, the variable delay circuit and the low-pass filter in response to the detected delay of the test output signal, thereby to calibrate the amplitude signal delay from the input of the delay-calibrating unit to the output of the low-pass filter.

13. The semiconductor integrated circuit according to claim 12, wherein the delay-calibrating unit includes a register, a digital comparator, a delay logic circuit, a phase comparator, an analog-voltage comparator, and a delay-adjust unit,
the digital comparator compares the test input signal with a digital value with a reference code set on the register,
the delay logic circuit generates a reference delay output signal in response to a compare-output signal from the digital comparator,
the analog-voltage comparator compares the test output signal at the output of the low-pass filter with a reference voltage, thereby to generate a voltage-compare-output signal,
the phase comparator generates a phase-difference-detection signal in response to the reference delay output signal generated by the delay logic circuit, and the voltage-compare-output signal generated by the analog-voltage comparator,
the delay-adjust unit generates a first delay control signal for controlling the quantity of delay of the variable delay circuit, and a second delay control signal for controlling the quantity of delay of the low-pass filter in response to the phase-difference-detection signal generated by the phase comparator, and
a voltage value of the reference voltage can be set to be substantially equal to a voltage value of an analog voltage into which the digital-to-analog converter converts the reference code set on the register.

14. The semiconductor integrated circuit according to claim 13, further comprising a signal generator operable to supply the test input signal to the input of the delay-calibrating unit in the operation of delay calibration,
wherein the signal generator is activated to generate the test input signal at time when power is turned on for an information-communication terminal equipped with the transmitter, and in the operation of delay calibration before a transmit operation by use of the information-communication terminal, which makes it possible to reduce a difference between the amplitude signal delay and phase signal delay.

15. The semiconductor integrated circuit according to claim 14, further comprising a digital calculation system operable to convert an in-phase signal and a quadrature signal of an orthogonal coordinate system which can be supplied through a digital interface, thereby to generate the amplitude component and the phase component,
wherein during the transmit operation, the amplitude component and phase component generated by the digital calculation system can be conveyed through the amplitude-signal path and phase-signal path respectively, and then synthesized, and in the operation of delay calibration before the transmit operation, the phase signal delay of the phase modulator is calibrated into the predetermined value by the phase-signal-delay-calibrating function, and in parallel with this, the signal generator is activated to generate the test input signal, whereby the reduction of the difference between the amplitude signal delay and phase signal delay is enabled.

16. The semiconductor integrated circuit according to claim 15, further comprising at least one of a mixer and regulator for synthesizing the amplitude component and phase component.

17. The semiconductor integrated circuit according to claim 15, wherein the variable delay unit is composed of an equalizer having a waveform-equalizing function.

18. The semiconductor integrated circuit according to claim 10, wherein the transmitter, for which the semiconductor integrated circuit is available, based on a Polar Modulation system and arranged to be capable of coping with both cases where the in-phase and quadrature signals of the orthogonal coordinate system, which can be supplied to the digital calculation system, are in conformity with GSM, and where the in-phase and quadrature signals are in conformity with EDGE.

* * * * *